(12) United States Patent
Shimizu et al.

(10) Patent No.: US 9,054,082 B2
(45) Date of Patent: Jun. 9, 2015

(54) SEMICONDUCTOR PACKAGE, SEMICONDUCTOR DEVICE, AND METHOD FOR MANUFACTURING SEMICONDUCTOR PACKAGE

(71) Applicant: SHINKO ELECTRIC INDUSTRIES CO., LTD., Nagano-ken (JP)

(72) Inventors: Noriyoshi Shimizu, Nagano (JP); Akio Rokugawa, Nagano (JP); Akihiko Tateiwa, Nagano (JP); Masato Tanaka, Nagano (JP)

(73) Assignee: Shinko Electric Industries Co., Ltd., Nagano-ken (JP)

( * ) Notice: Subject to any disclaimer, the term of this patent is extended or adjusted under 35 U.S.C. 154(b) by 67 days.

(21) Appl. No.: 13/910,325

(22) Filed: Jun. 5, 2013

(65) Prior Publication Data

US 2013/0328211 A1  Dec. 12, 2013

(30) Foreign Application Priority Data

Jun. 6, 2012  (JP) .................................. 2012-129135

(51) Int. Cl.
| | | |
|---|---|---|
| *H01L 23/538* | (2006.01) | |
| *H01L 23/48* | (2006.01) | |
| *H01L 23/31* | (2006.01) | |
| *H01L 25/10* | (2006.01) | |
| *H01L 23/14* | (2006.01) | |
| *H01L 23/498* | (2006.01) | |

(52) U.S. Cl.
CPC ......... *H01L 23/481* (2013.01); *H01L 2224/131* (2013.01); *H01L 2224/13144* (2013.01); *H01L 2224/19* (2013.01); *H01L 2224/20* (2013.01); *H01L 2224/16227* (2013.01); *H01L 23/3128* (2013.01); *H01L 2224/16225* (2013.01); *H01L 25/105* (2013.01); *H01L 2225/1035* (2013.01); *H01L 2225/1058* (2013.01); *H01L 23/145* (2013.01); *H01L 23/49816* (2013.01); *H01L 23/49827* (2013.01); *H01L 23/5389* (2013.01)

(58) Field of Classification Search
CPC ............ H01L 23/3107; H01L 23/3185; H01L 23/5389; H01L 23/481; H01L 24/97; H01L 23/5384; H01L 23/49827; H01L 21/76879; H01L 21/76898
USPC .................................. 257/621, 686, 774, 777
See application file for complete search history.

(56) References Cited

U.S. PATENT DOCUMENTS

2014/0175663 A1 * 6/2014 Chen et al. .................... 257/774

FOREIGN PATENT DOCUMENTS

| | | |
|---|---|---|
| JP | 2006-196785 | 7/2006 |
| JP | 2011-187800 | 9/2011 |

* cited by examiner

*Primary Examiner* — Matthew W Such
*Assistant Examiner* — Scott Stowe
(74) *Attorney, Agent, or Firm* — Fish & Richardson P.C.

(57) ABSTRACT

A semiconductor device includes a semiconductor chip, a core substrate, first and second insulating layers, and first and second wiring layers. Adhesiveness of the insulating layer to a metal is higher than adhesiveness of the core substrate to the metal. A through hole extends through the insulating layer in the thickness direction. A through via covers the hole wall surface of the through hole, extends in the thickness direction traversing the insulating layer, and electrically connects the first and second wiring layers.

10 Claims, 17 Drawing Sheets

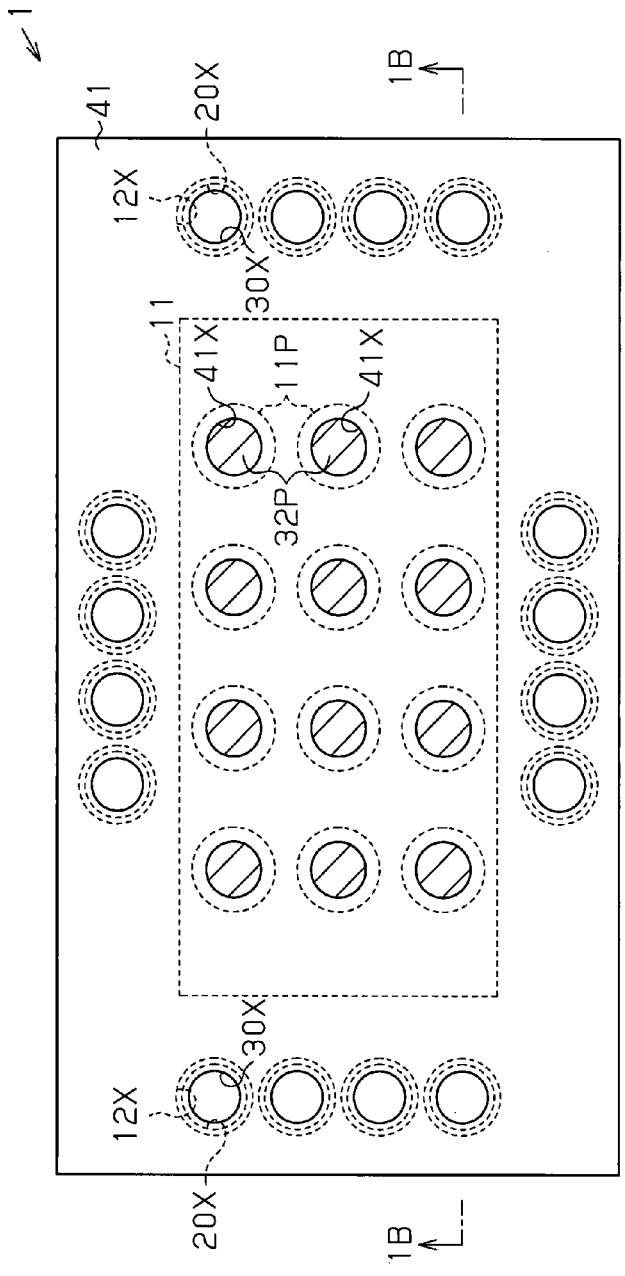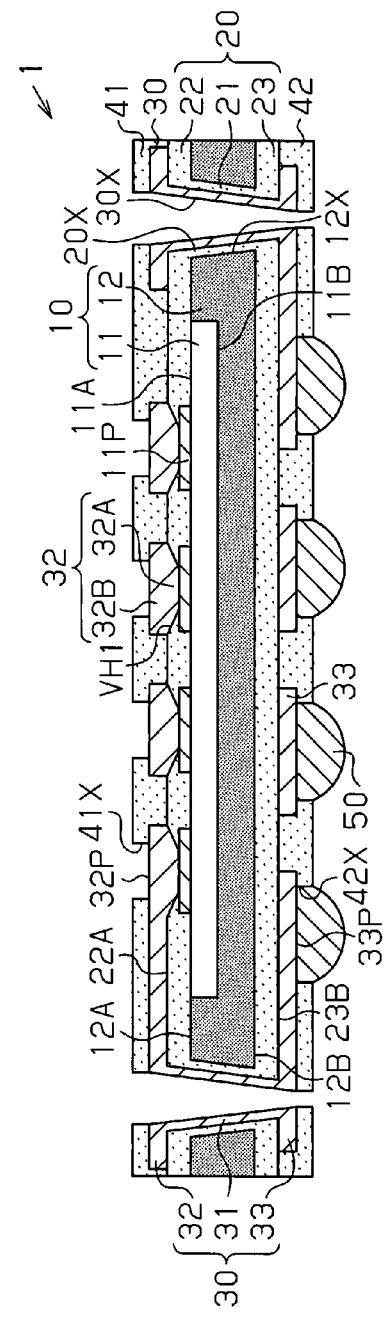

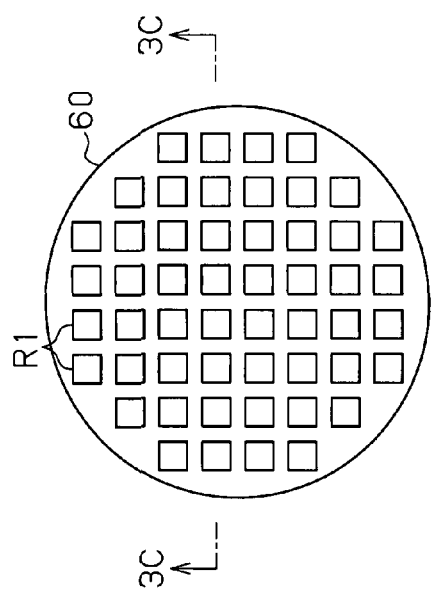
Fig.3A
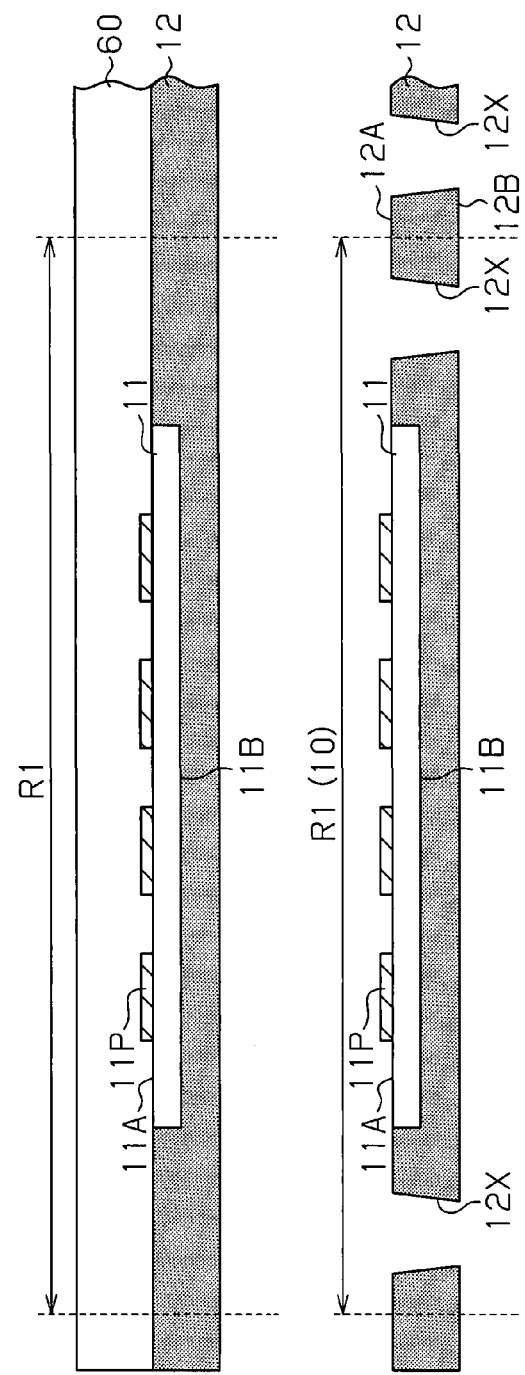
Fig.3B
Fig.3C

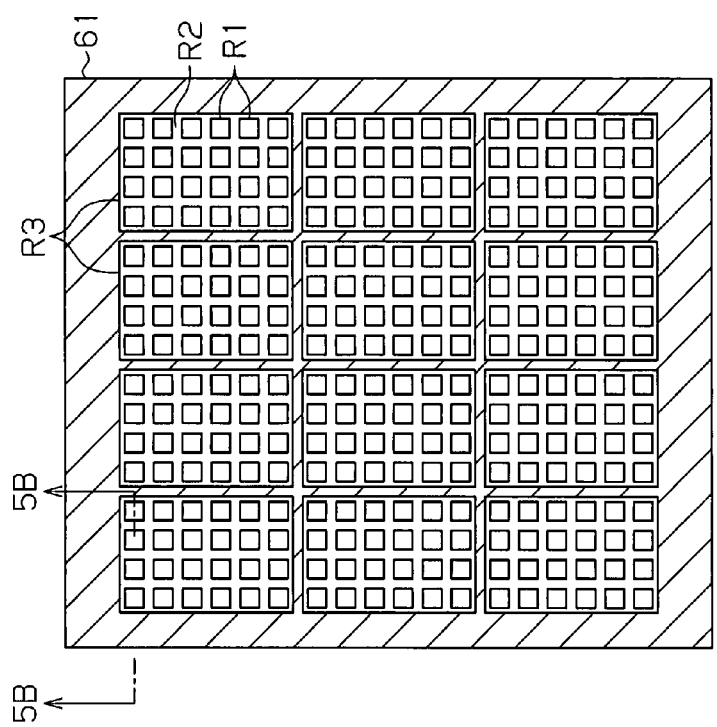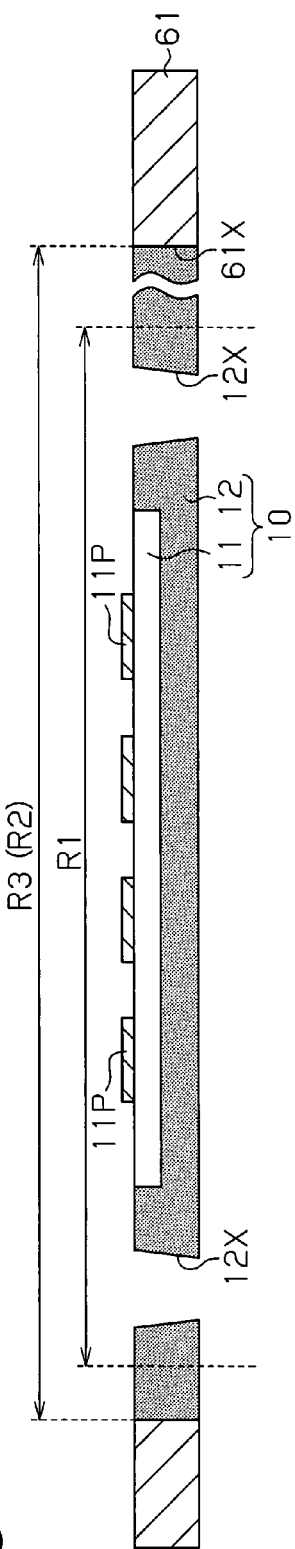

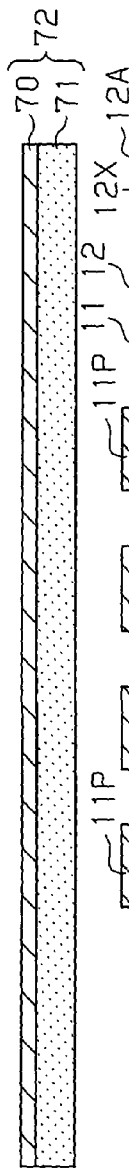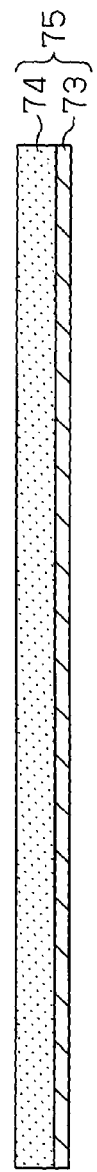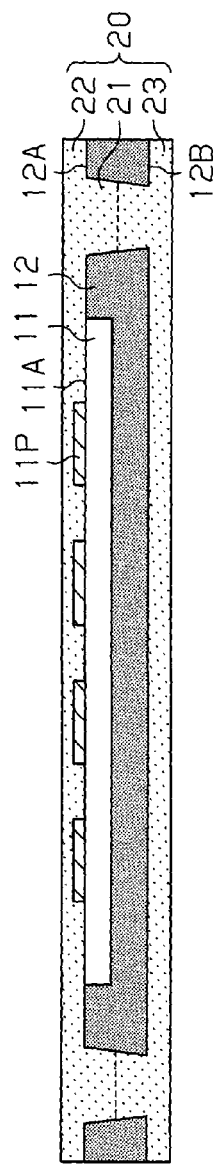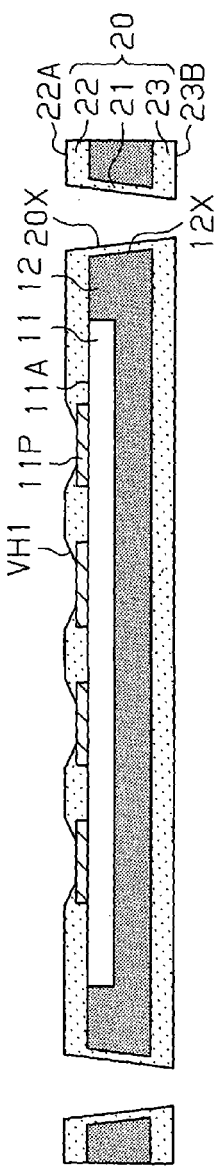
Fig.6A  Fig.6B  Fig.6C

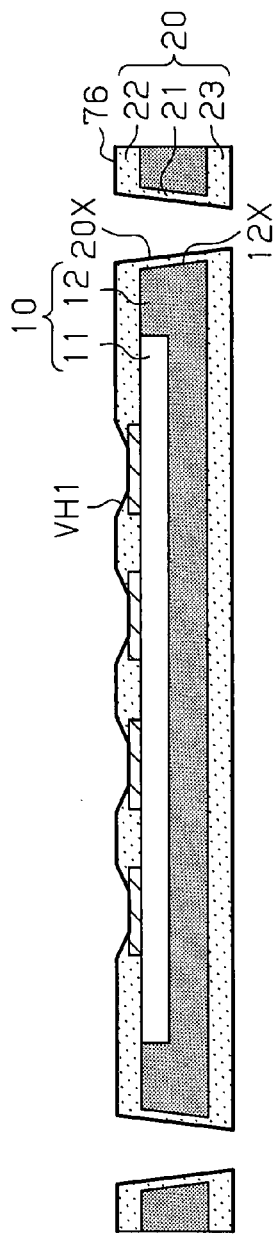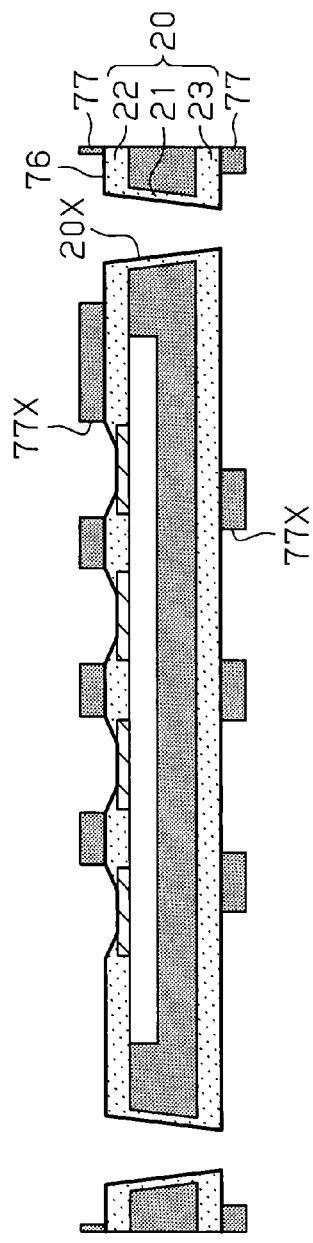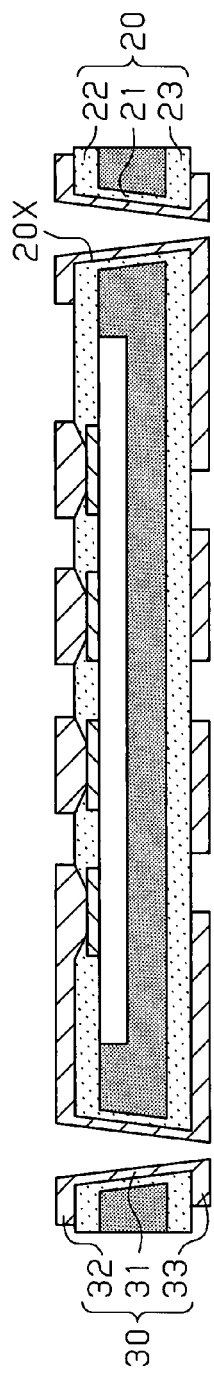
Fig.7A
Fig.7B
Fig.7C

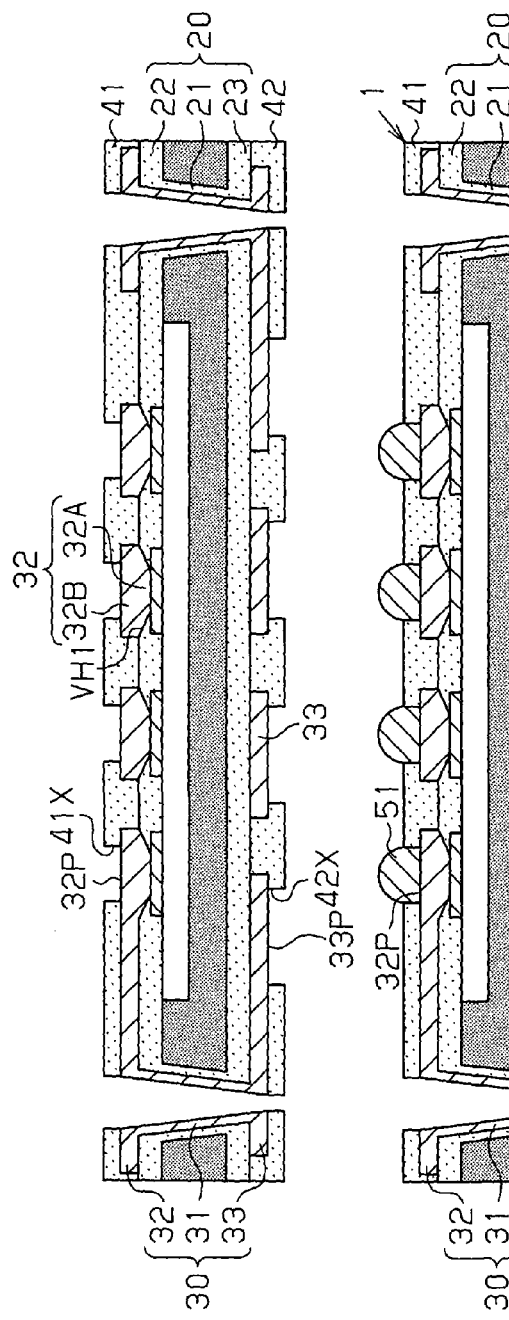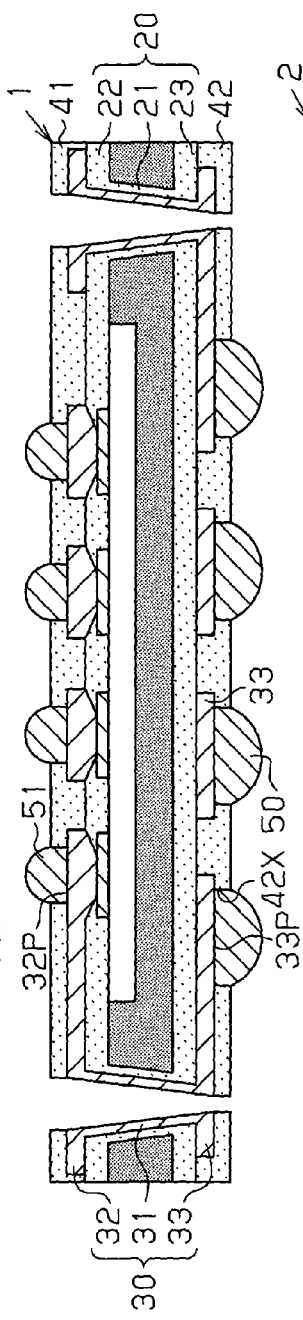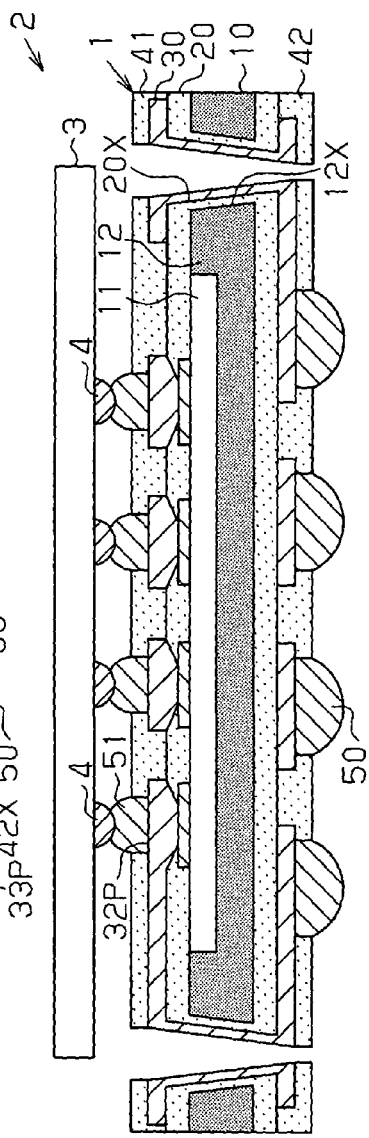

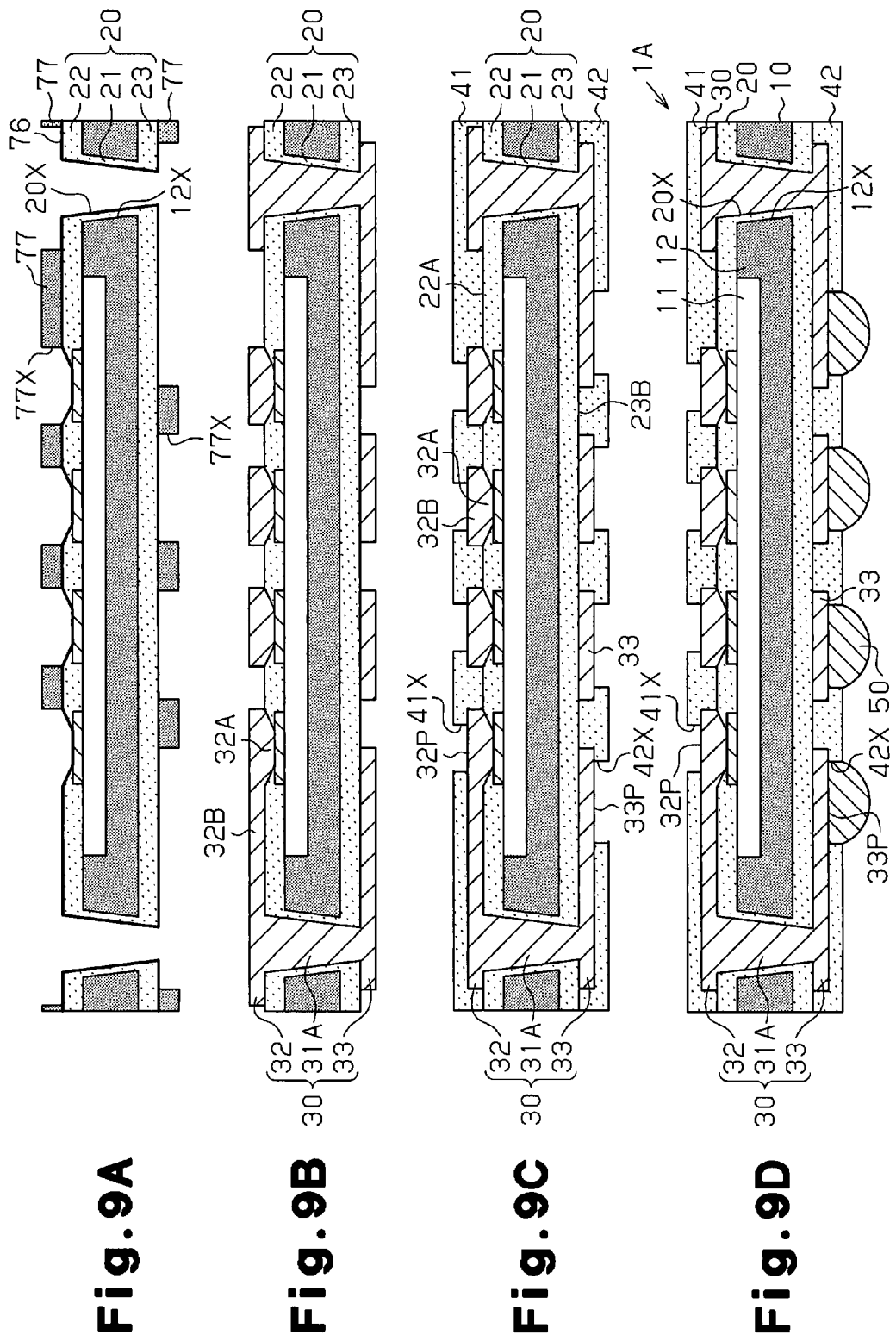

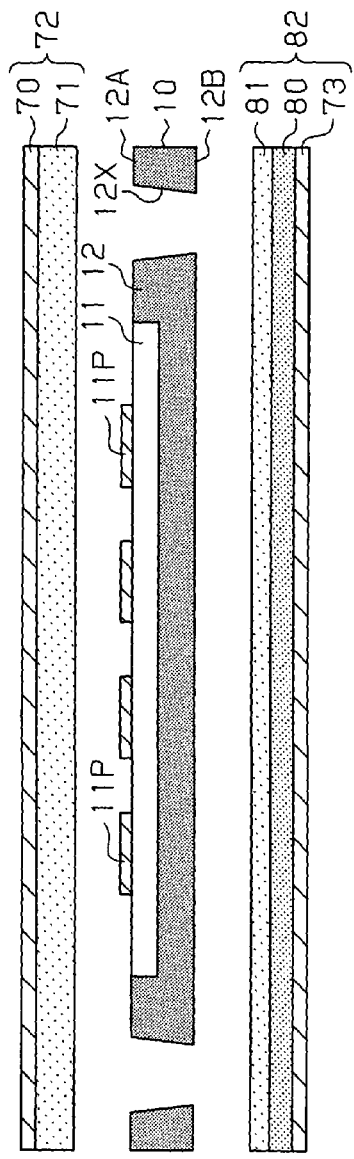
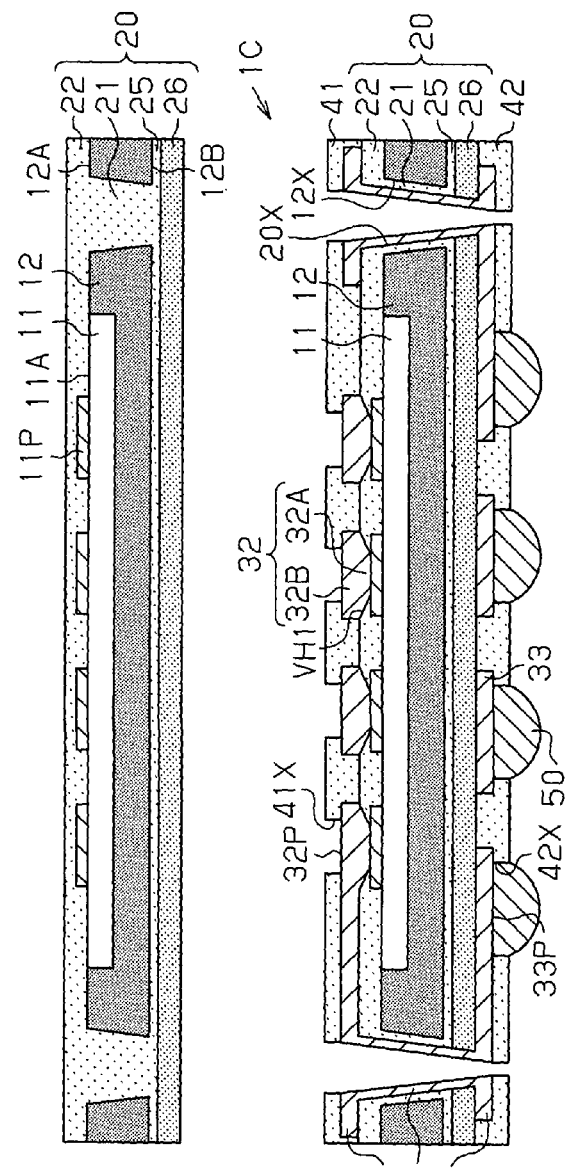
Fig.11A
Fig.11B
Fig.11C

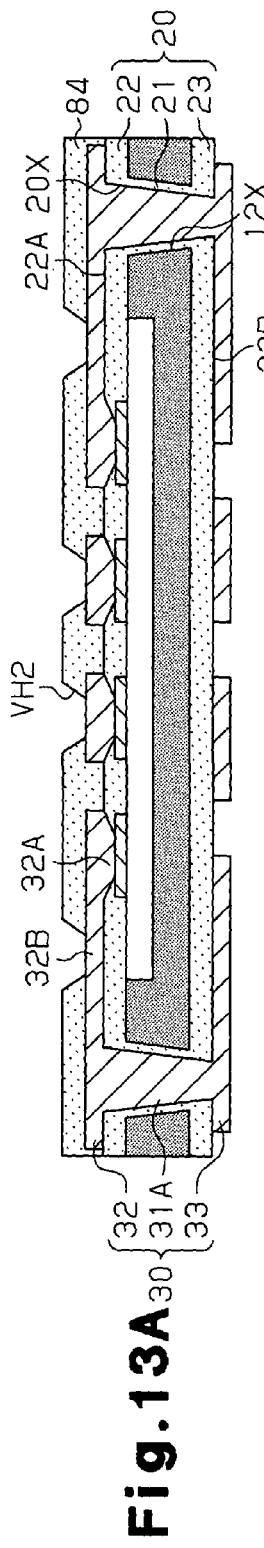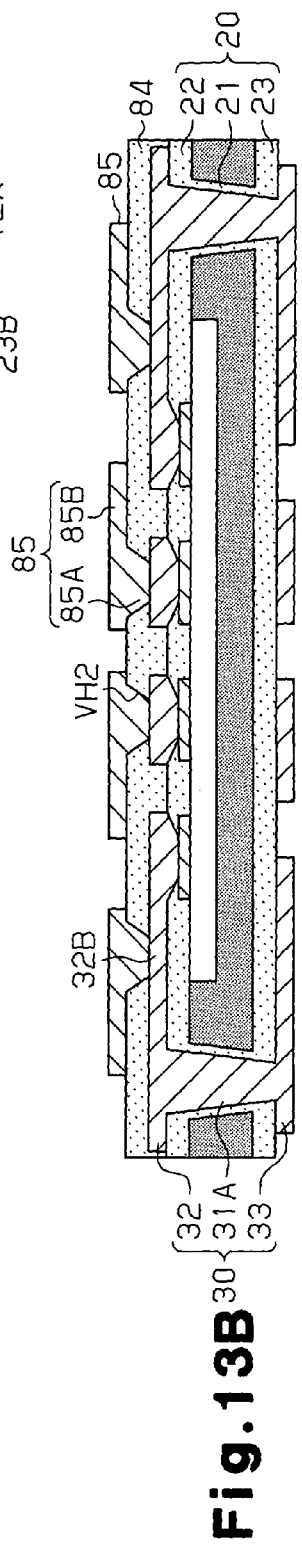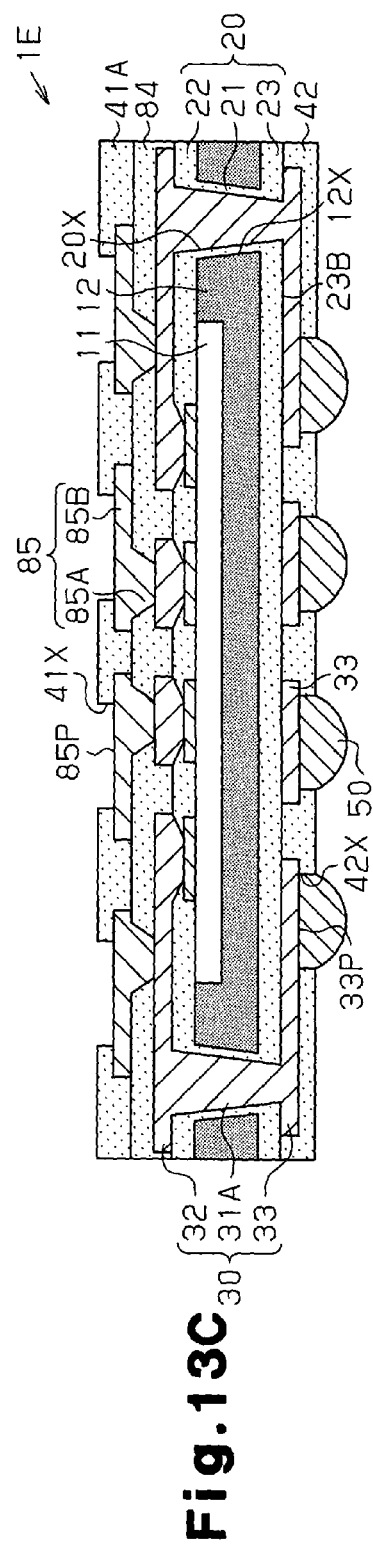

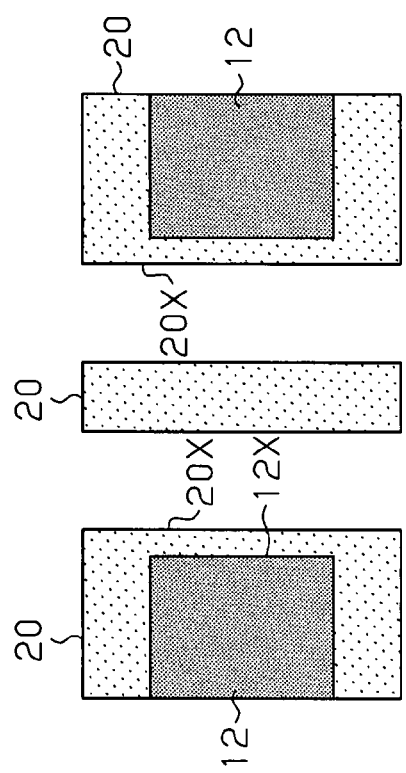
Fig.17A
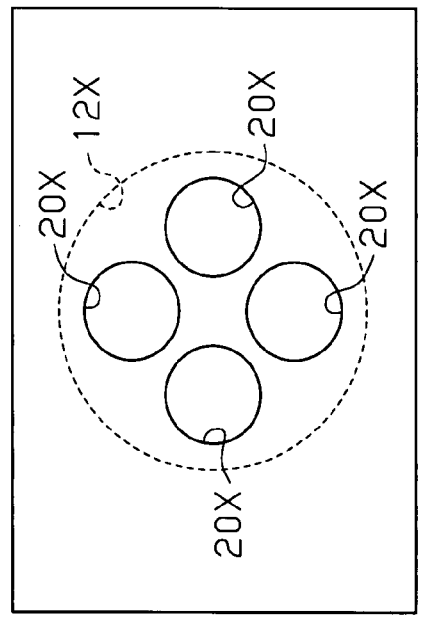
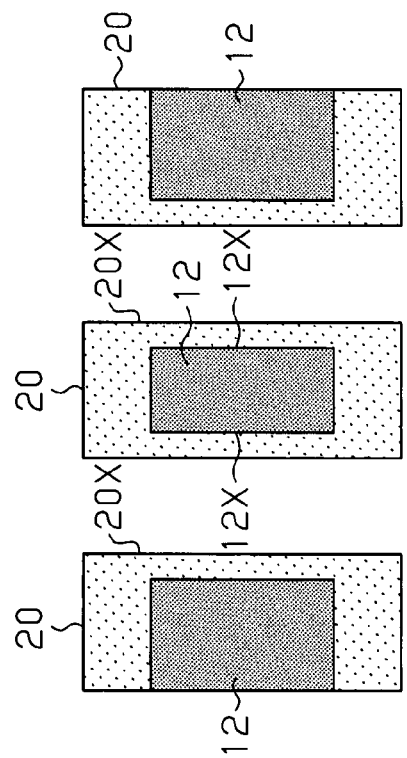
Fig.17B
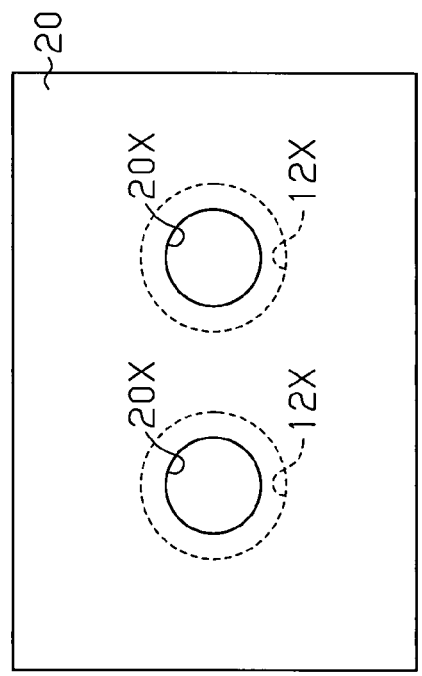

SEMICONDUCTOR PACKAGE, SEMICONDUCTOR DEVICE, AND METHOD FOR MANUFACTURING SEMICONDUCTOR PACKAGE

CROSS-REFERENCE TO RELATED APPLICATIONS

This application is based upon and claims the benefit of priority from prior Japanese Patent Application No. 2012-129135, filed on Jun. 6, 2012, the entire contents of which are incorporated herein by reference.

BACKGROUND ART

The present disclosure relates to a semiconductor package, a semiconductor device, and a method for manufacturing a semiconductor package.

The performance of electronic devices using semiconductor devices such as semiconductor chips has become higher. It is thus desirable that the density be increased for semiconductor chips that are mounted on a substrate. It is also desirable that substrates including semiconductor chip be smaller is size and occupy less space.

There are various structures for chip-incorporating type semiconductor packages that embed semiconductor chips. For example, a known structure for such a type of a semiconductor package includes a semiconductor chip and a core substrate, which embeds the semiconductor chip. Wiring layers and an external connection terminal, which are formed on an upper surface and a lower surface of the core substrate, are electrically connected to an electrode pad of the semiconductor chip (for example, refer to Japanese Laid-Open Patent Publication Nos. 2006-196785 and 2011-187800). In such a semiconductor package, a through via that extends through the core substrate in a thickness direction electrically connects the wiring layers formed on the upper surface and the lower surface of the core substrate.

A mold resin, for example, is used as the material of a core substrate in a semiconductor package. The mold resin contains a relatively large number of inorganic fillers having large grain diameters. This decreases the coefficient of thermal expansion of the core substrate, and the coefficient of thermal expansion of the core substrate approaches the coefficient of thermal expansion of the semiconductor chip. Thus, warping of the semiconductor package is suppressed. However, when the mold resin is used as the material of the core substrate and a through hole extending through the core substrate in the thickness direction is formed, the large inorganic fillers are exposed from a hole wall surface of the through hole. This forms many ridges and valleys, which may be large, in the hole wall surface thereby making it difficult to form the through via in the through hole. For example, the formation of an electroless plating film may be hindered in a portion of the hole wall surface of the through hole. Otherwise, a large void may form in the through via due to the difference in the plating deposition speed caused by the difference in the surface roughness. An incomplete through via would lower the reliability of the electrical connection between the upper side and the lower side of the core substrate.

SUMMARY

One aspect of the present disclosure is a semiconductor device provided with a semiconductor chip including a first main surface and a second main surface, which is opposite to the first main surface. Electrode pads are formed on the first main surface. A core substrate embeds at least the second main surface of the semiconductor chip. The core substrate includes a first surface and a second surface respectively corresponding to the first main surface and the second main surface of the semiconductor chip. The core substrate also includes a hole wall surface that defines a first through hole extending through the core substrate in a thickness direction. A first insulating layer covers the hole wall surface of the first through hole. The first insulating layer in the first through hole includes a hole wall surface that defines a second through hole extending through the core substrate in the thickness direction. A second insulating layer covers the first surface of the core substrate. A third insulating layer covers the second surface of the core substrate. A first wiring layer is stacked on the second insulating layer and electrically connected to the electrodes pads. A second wiring layer is stacked on the third insulating layer. A through via covers the hole wall surface of the second through hole, extends in the thickness direction traversing the first insulating layer, the second insulating layer, and the third insulating layer, and electrically connects the first wiring layer and the second wiring layer. Adhesiveness of the first to third insulating layers to a metal is higher than adhesiveness of the core substrate to the metal.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which:

FIG. 1A is a schematic plan view showing one embodiment of a semiconductor package;

FIG. 1B is a schematic cross-sectional view taken along line 1B-1B in FIG. 1A;

FIG. 3A is a schematic plan view illustrating one embodiment of a method for manufacturing a semiconductor package;

FIG. 3B is a schematic cross-sectional view illustrating one embodiment of a method for manufacturing a semiconductor package;

FIG. 3C is a cross-sectional view taken along line 3C-3C in FIG. 3A;

FIG. 5A is a schematic plan view illustrating one embodiment of a method for manufacturing a semiconductor package;

FIG. 5B is a schematic cross-sectional view taken along line 5B-5B in FIG. 5A;

FIGS. 6A to 6C, 7A to 7C, and 8A to 8B are cross-sectional views corresponding to FIG. 1B illustrating one embodiment of a method for manufacturing a semiconductor package;

FIG. 8C is a cross-sectional view illustrating one embodiment of a method for manufacturing the semiconductor device;

FIGS. 9A to 9D are schematic cross-sectional views illustrating a first modification of a method for manufacturing a semiconductor package;

FIGS. 11A to 11C are schematic cross-sectional views illustrating a third modification of a method for manufacturing a semiconductor package;

FIGS. 13A to 13C are schematic cross-sectional views illustrating a fifth modification of a method for manufacturing a semiconductor package;

FIGS. 17A and 17B are schematic views showing a semiconductor package including another through hole.

DETAILED DESCRIPTION OF EMBODIMENTS

Figure 2:
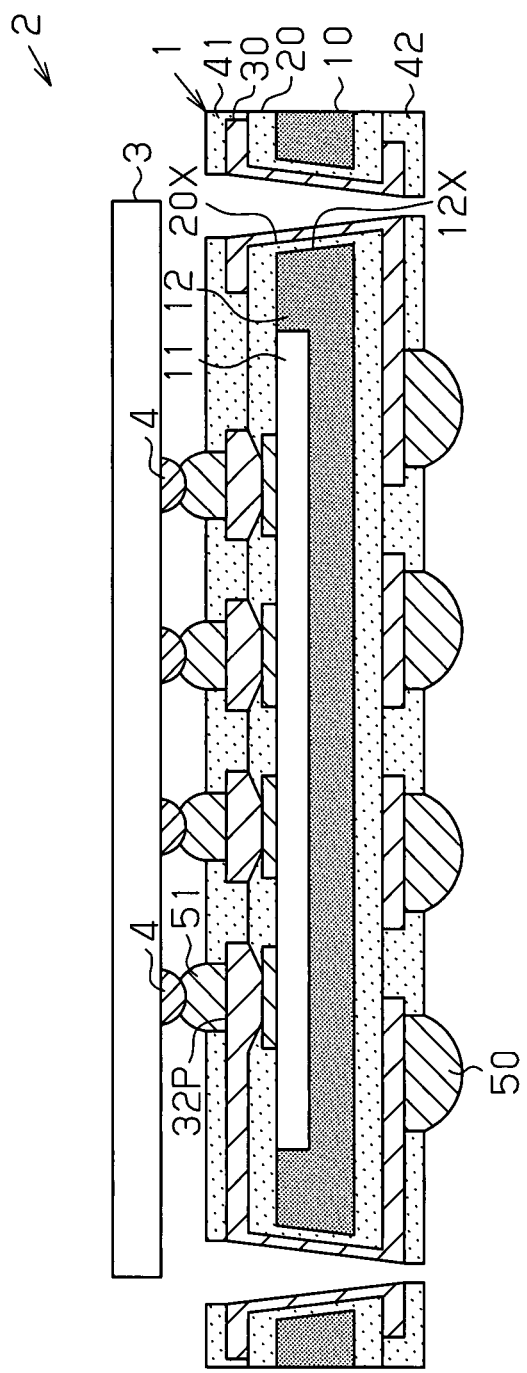
FIG. 2 is a schematic cross-sectional view showing one embodiment of a semiconductor device.

Embodiments will now be described with reference to the accompanying drawings. Elements in the drawings are illustrated for simplicity and clarity and have not necessarily been drawn to scale. Hatching lines may not be shown in cross-sectional views to facilitate understanding of components in cross-sectional structure.

One embodiment will now be described with reference to FIGS. 1 to 8.

As shown in FIG. 1B, a semiconductor package 1 includes a core 10, an insulating layer 20, a wiring layer 30, solder resist layers 41 and 42, and external connection terminals 50. The core 10 includes a certain number of (one in FIG. 1) semiconductor chips 11 and a core substrate 12 embedding (incorporating) each semiconductor chip 11.

A logic chip, such as a central processing unit (CPU) chip or a graphics processing unit (GPU) chip, may be used as the semiconductor chip 11. Further, a memory chip such as a dynamic random access memory (DRAM) chip, a static random access memory (SRAM) chip, or a flash memory chip, may be used as the semiconductor chip 11.

The semiconductor chip 11 is formed from, for example, a semiconductor substrate. Silicon (Si), for example, may be used as the material of the semiconductor substrate. The semiconductor chip 11 includes a semiconductor integrated circuit (not shown) formed over a first main surface 11A (upper surface in FIG. 1B). Although not shown in the drawings, the semiconductor integrated circuit includes a diffusion layer formed on the semiconductor substrate, an insulating layer stacked on the semiconductor substrate, and a via and wiring arranged in the stacked insulating layer. Electrode pads 11P electrically connected to the semiconductor integrated circuit are arranged on the semiconductor integrated circuit. For example, as shown in FIG. 1A, the electrode pads 11P are arranged in a matrix array as viewed from above (refer to circles indicated by broken lines in the central section). Aluminum (Al), an alloy of copper (Cu) and Al, and an alloy of Cu, Al, and Si, for example, may be used as the material of the electrode pad 11P.

The semiconductor chip 11 has a size of, for example, approximately 9 mm×9 mm as viewed from above, and a thickness of, for example, from approximately 50 μm to 200 μm. In the present embodiment, the semiconductor chip 11 is made of silicon, and the coefficient of thermal expansion of the semiconductor chip 11 is approximately 3.4 ppm/° C. In the following description, the first main surface 11A of the semiconductor chip 11 may be referred to as a circuit forming surface.

As shown in FIG. 1B, the core substrate 12 is formed to cover the semiconductor chip 11. For example, the core substrate 12 is formed to cover the semiconductor chip 11 at a second main surface 11B, which is opposite to the circuit forming surface 11A of, and side surfaces. The circuit forming surface 11A of the semiconductor chip 11 is exposed at the same side as a first surface (e.g., upper surface) 12A of the core substrate 12. Thus, the semiconductor chip 11 is arranged toward the upper surface 12A in the thickness direction of the core substrate 12. A resin material, in which, for example, an inorganic filler such as silica ($SiO_2$) is mixed with an epoxy resin, may be used as the material of the core substrate 12. Specifically, a resin material in which the content of an inorganic filler is approximately 80 wt. % to 90 wt % may be used as the material of the core substrate 12. In this case, the coefficient of thermal expansion of the core substrate 12 approaches the coefficient of thermal expansion of the semiconductor chip 11 (e.g., 3.4 ppm/° C.). For example, the coefficient of thermal expansion decreases as the content of the filler increases. Further, an inorganic filler having a relatively large grain diameter (e.g., approximately 30 μm to 50 μm) may be used as the inorganic filler. A mold resin formed through a transfer molding process, a compression molding process, or an injection molding process may be used for the core substrate 12.

Through holes 12X are formed in certain locations (two locations in FIG. 1B) of the core substrate 12. For example, as shown in FIG. 1A, the core substrate 12 includes through holes 12X arranged along each of the four sides forming the contour of the semiconductor package 1. Each through hole 12X is circular, for example, as viewed from above. As shown in FIG. 1B, the through hole 12X extends through the core substrate 12 in the thickness direction. Specifically, the through hole 12X extends through the core substrate 12 from the upper surface 12A to a second surface (e.g., lower surface) 12B at the opposite side of the upper surface 12A. More specifically, the through hole 12X has a tapered shape with a diameter that decreases from the upper surface 12A, which is substantially flush with the circuit forming surface 11A of the semiconductor chip 11, toward the lower surface 12B. The core substrate 12 may have a thickness of, for example, approximately 150 to 200 μm. The through hole 12X includes an open end in the upper surface 12A with a diameter of, for example, approximately 150 μm to 200 μm.

The insulating layer 20 is formed to cover the semiconductor chip 11 and the core substrate 12. The insulating layer 20 includes a first insulating layer 21, a second insulating layer 22, and a third insulating layer 23. The first insulating layer 21 covers a hole wall surface of the through hole 12X. The second insulating layer 22 covers the upper surface 12A of the core substrate 12, and the circuit forming surface 11A of the semiconductor chip 11, and the electrode pads 11P. The third insulating layer 23 covers the lower surface 12B of the core substrate 12. The insulating layer 20 (first to third insulating layers 21 to 23) has a higher adhesiveness to a metal film (e.g., electroless plating) than the core substrate 12. A buildup resin (epoxy resin mixed with inorganic filler such as silica and the like), for example, may be used as the material of the insulating layer 20. In one example, the material of the insulating layer 20 is a mixture of an inorganic filler and a resin material. The content of the inorganic filler in the mixed material is less than the content of the inorganic filler in the core substrate 12.

The content of the inorganic filler in the insulating layer 20 may be, for example, approximately 30 wt % to 60 wt %. Preferably, the grain diameter of the inorganic filler in the insulating layer 20 is smaller than that of the filler of the core substrate 12. The grain diameter of the inorganic filler in the insulating layer 20 may be, for example, approximately 1 µm to 1.5 µm. Preferably, the material of the insulating layer 20 has a composition adjusted so that the peel strength of the electroless plating formed on the insulating layer, which is formed from the above material, is at least higher than the peel strength of the electroless plating formed on the core substrate 12. For example, the peel strength may be adjusted by changing the content of the epoxy resin and the inorganic filler in the material of the insulating layer 20. The peel strength indicates the adhesive force of the conductor pattern (electroless plating) and the insulating layer.

Through holes 20X are formed in certain locations (two locations in FIG. 1B) of the insulating layer 20. For example, as shown in FIG. 1A, the insulating layer 20 includes through holes 20X arranged along each of the four sides forming the contour of the semiconductor package 1. Specifically, each through hole 20X is generally circular and smaller than the through holes 12X as viewed from above. As shown in FIG. 1B, the through hole 20X extends through the insulating layer 20 in the thickness direction. Specifically, the through hole 20X extends from an upper surface 22A of the second insulating layer 22 to a lower surface 23B of the third insulating layer 23. More specifically, the through hole 20X is tapered shape and has a diameter that decreases from the upper surface 22A of the second insulating layer 22 toward the lower surface 23B of the third insulating layer 23. In other words, the hole wall surface of the through hole 20X is formed along the hole wall surface of the through hole 12X of the core substrate 12. Further, the through hole 20X is formed so that the hole wall surface of the through hole 12X is not exposed from the insulating layer 20. Preferably, the hole wall surface of the through hole 20X has a lower surface roughness than the hole wall surface of the through hole 12X. In one example, the hole wall surface of the through hole 20X may be a smooth surface (low roughness surface) with little ridges and valleys. In another example, the hole wall surface of the through hole 20X is a low roughness surface having fine ridges and valleys forming small differences in levels. Preferably, the surface roughness Ra of the hole wall surface in the through hole 20X is approximately 300 nm to 500 nm. The surface roughness Ra may be referred to as an arithmetic average roughness. The surface roughness Ra is obtained by obtaining an arithmetic average of the absolute values of the heights taken at various measurement points in a measurement region and measured from an average height surface in the measurement region.

The second insulating layer 22 includes via holes that extend through the second insulating layer 22 and expose the upper surfaces of the electrode pads 11P of the semiconductor chip 11. The thickness from the upper surface 12A of the core substrate 12 to the upper surface 22A of the second insulating layer 22 is, for example, approximately 30 µm to 65 µm. The thickness from the lower surface 12B of the core substrate 12 to the lower surface 23B of the third insulating layer 23 is, for example, approximately 30 µm to 65 µm. Each through hole 20X has a diameter at the open end in the second insulating layer 22 of, for example, approximately 80 µm to 110 µm.

The wiring layer 30 includes through vias 31, a first wiring layer 32, and a second wiring layer 33. Copper or copper alloy, for example, may be used as the material of the wiring layer 30 (through vias 31, first wiring layer 32, and second wiring layer 33).

The through vias 31 are formed in the through holes 20X. Specifically, each through via 31 is formed along the hole wall surface of the corresponding through hole 20X to cover the hole wall surface. Thus, the through via 31 is tapered and has a diameter that decreases from one end (end in first wiring layer 32) toward the other end (end in the second wiring layer 33). The through via 31 has one end connected to the first wiring layer 32 and the other end connected to the second wiring layer 33. The via 31 is, for example, generally annular as viewed from above.

The first wiring layer 32 is formed on the upper surface 22A of the second insulating layer 22. The first wiring layer 32 includes a via wire 32A, which is filled in each via hole VH1, and a wiring pattern 32B, which is formed on the upper surface 22A of the second insulating layer 22. The via wires 32A are electrically connected to the electrode pads 11P exposed from the bottom portion of the via hole VH1. The via wires 32A are also electrically connected to the wiring pattern 32B. Each via hole VH1 and each via wire 32A are tapered and have a diameter that decreases from the upper side toward the lower side (toward the semiconductor chip 11) in FIG. 1B. The via holes VH1 and the via wires 32A are, for example, circular as viewed from above. The via holes VH1 and the via wires 32A have diameters of, for example, approximately 20 µm to 40 µm. The wiring pattern 32B is electrically connected to the via wires 32A, and electrically connected to the through vias 31. The wiring pattern 32B has a thickness of, for example, approximately 15 µm to 35 µm.

The second wiring layer 33 is formed on the lower surface 23B of the third insulating layer 23. The second wiring layer 33 is electrically connected to the through via 31. The first wiring layer 32 and the second wiring layer 33 are electrically connected to each other through the through via 31. Thus, one surface side (upper surface 12A, 22A side) and the other surface side (lower surface 12B, 23B side) of the core substrate 12 and the insulating layer 20 are electrically connected through the through via 31, which extends through the core substrate 12 and the insulating layer 20. The thickness of the second wiring layer 33 is, for example, approximately 15 µm to 35 µm.

The wiring layer 30 includes through holes 30X in a region where the through holes 12X and 20X are formed. The through holes 30X are generally circular and smaller than the through holes 12X and 20X as viewed from above. Further, the through holes 30X may be filled with a resin.

The solder resist layer 41 is formed on the upper surface 22A of the second insulating layer 22 to cover the first wiring layer 32. The solder resist layer 41 includes openings 41X exposing portions of the wiring pattern 32B of the first wiring layer 32 as connection pads 32P. The connection pads 32P are electrically connected to a further semiconductor chip 3 (see FIG. 2), another semiconductor package, and the like. An organic solderability preservative (OSP) process may be performed on the wiring pattern 32B exposed from the openings 41X to form an OSP film when required, and the semiconductor chip 3 and the like may be connected to the OSP film. A metal layer may be formed on the wiring pattern 32B exposed from the openings 41X, and the semiconductor chip 3 and the like may be connected to the metal layer. An example of the metal layer includes, a gold (Au) layer, a nickel (Ni)/Au layer (metal layer in which an Ni layer and an Au layer are stacked in this order on the wiring pattern 32B), a Ni/palladium (Pd)/Au layer (metal layer in which an Ni layer, a Pd layer, and an Au layer are stacked in this order on the wiring pattern 32B), and the like.

As shown in FIG. 1A, the openings 41X and the connection pads 32P are, for example, circular and have a diameter of approximately 100 µm to 200 µm. The opening 41X and the connection pad 32P are arranged in a matrix array as viewed from above. The thickness from the upper surface 22A of the second insulating layer 22 to the upper surface of the solder resist layer 41 is, for example, approximately 20 µm to 40 µm. An epoxy or acrylic insulative resin, for example, may be used as the material of the solder resist layer 41.

As shown in FIG. 1B, the solder resist layer 42 is formed on the lower surface 23B of the third insulating layer 23 to cover the second wiring layer 33. The solder resist layer 42 includes openings 42X exposing portions of the second wiring layer 33 as external connection pads 33P. The external connection terminals 50 are connected to the external connection pads 33P. The external connection terminals 50, which may be solder balls, lead pins, and the like, are used, for example, to mount the semiconductor package 1 on a motherboard and the like. An OSP process is performed on the second wiring layer 33 exposed from the opening 42X to form the OSP film when required, and the external connection terminals 50 may be connected to the OSP film. A metal layer may be formed on the second wiring layer 33 exposed from the openings 42X, and the external connection terminal 50 and the like may be connected to the metal layer. An example of the metal layer includes an Au layer, a Ni/Au layer, a Ni/Pd/Au layer, and the like. The second wiring layer 33 (or the OSP film or metal layer when the OSP film or the metal layer is formed on the second wiring layer 33) is exposed from the openings 42X may be used as the external connection terminal.

The openings 42X and the external connection pads 33P are, for example, circular as viewed from above and have a diameter of approximately 200 µm to 300 µm. The thickness from the lower surface 23B of the third insulating layer 23 to the lower surface of the solder resist layer 42 is, for example, approximately 20 µm to 40 µm. An epoxy or acrylic insulative resin, for example, may be used as the material of the solder resist layer 42.

A structure of the semiconductor device 2 will now be described.

As shown in FIG. 2, the semiconductor device 2 includes the semiconductor package 1 and the semiconductor chip (semiconductor package) 3, which is stacked and joined with the semiconductor package 1.

Terminals such as solder balls 51 are formed on the connection pads 32P of the semiconductor package 1. For example, eutectic solder and lead (Pb)-free solder (Sn—Ag, Sn—Cu, Sn—Ag—Cu, etc.) may be used for the solder ball 51.

The semiconductor chip 3 includes a plurality of bumps 4 formed on a circuit forming surface (lower surface in FIG. 2). The bumps 4 and the solder ball 51 electrically connect the semiconductor chip 3 to the connection pads 32P of the semiconductor package 1. In other words, the semiconductor chip 3 is flip-flop-connected to the semiconductor package 1.

For example, a memory chip such as DRAM chip, SRAM chip, flash memory chip, and the like may be used as the semiconductor chip 3. For example, gold bumps and solder bumps may be used as the bumps 4.

The insulating layer 20 has a higher adhesiveness to the metal film (e.g., electroless plating film) than the core substrate 12. The insulating layer 20 covers the hole wall surface of each through hole 12X in the core substrate 12. Each through hole 20X has a smaller diameter than the through hole 12X formed in the insulating layer 20, and each through via 31 is formed to cover the hole wall surface of the corresponding through hole 20X. In the insulating layer 20, the content of an inorganic filler that lowers the adhesiveness of the insulating layer 20 and the electroless plating film is less than the core substrate 12. Thus, when forming the through vias 31 in the electroless plating process and the electrolytic plating process, the electroless plating film are formed in a desirable manner on the hole wall surface of the through hole 20X. This in contrast with when forming the electroless plating film on the hole wall surface of the through hole 12X. This solves the problem in which the electroless plating film cannot be formed on portions of the hole wall surface of the through hole 20X, and the electroless plating film can be formed over the entire hole wall surface of the through hole 20X. Since the through via 31 is formed in the electrolytic plating process that uses the electroless plating film as a power supplying layer, the reliability may be increased for the electrical connection between the upper side and the lower side of the core substrate 12.

The content of the inorganic filler of the insulating layer 20 is small compared to that of the core substrate 12, and the grain diameter of the inorganic filler of the insulating layer 20 is small compared to that of the core substrate 12. The size of the bumps is smaller in the hole wall surface of the through hole 20X of the insulating layer 20 than in the hole wall surface of the through hole 12X of the core substrate 12. Thus, when the electrolytic plating process using the electroless plating film as the power supplying layer is performed, the formation of large voids in the through vias 31 may be suppressed due to the difference in the plating deposition speed resulting from the difference in the surface roughness. In other words, the through vias 31 are free of defects such as voids and may be formed in a desirable manner in the through holes 20. Therefore, the reliability of the electrical connection may be increased between the upper side and the lower side of the core substrate 12.

A method for manufacturing the semiconductor package 1 will now be described.

First, referring to FIG. 3A, a support substrate 60, which is generally circular as viewed from above, is prepared. The support substrate 60 is a disk-shaped substrate having a diameter of twelve inches, for example. A viscous film, for example, may be used as the material of the support substrate 60. An array of first regions R1 are set in the support substrate 60 where the core 10 is formed (see FIG. 1B). As shown in FIG. 3B, a semiconductor chip 11 is arranged at a predetermined position in each first region R1. The semiconductor chip 11 may be manufactured in the following manner, for example.

First, a certain device process is performed on one surface of a silicon wafer having a certain size (e.g., diameter of twelve inches and thickness of 750 µm) to form an array of devices (e.g., active elements such as CPUs, etc.). A passivation film containing silicon nitride (SiN), phosphorous glass (PSG) and the like is formed on the surface at the side where the devices are formed. Then, a laser beam or the like is used to remove portions of the passivation film corresponding to portions (electrode pads) of an aluminum wiring layer in a certain pattern on each device. The electrode pads 11P are formed on the electrode pad by, for example, sputtering or plating copper. The electrode pads 11P may be post electrodes. Next, the silicon wafer is polished to a predetermined thickness (e.g., approximately 100 µm to 200 µm) and diced into individual device units (e.g., size of 10 mm×10 mm) by a dicer and the like. This obtains a semiconductor chip 11 with the electrode pads 11P formed on one surface (circuit forming surface 11A) from each device unit.

In the illustrated example, the semiconductor chips 11 are checked for defects before the dicing process. Only the semiconductor chips 11 that pass the check are selected after the dicing process and rearranged in a face-down manner at predetermined locations on the support substrate 60 (first region R1).

In the next step, the core substrate 12 is formed to seal the semiconductor chip 11 rearranged on the support substrate 60 (see FIG. 3B). Specifically, the core substrate 12 is formed to cover the second main surface 11B and the side surfaces of the semiconductor chip 11. The core substrate 12 may be formed, for example, through a resin molding process. For example, when using a thermosetting molding resin as the material of the core substrate 12, the support substrate 60 including a large number of the semiconductor chips 11 is arranged in a mold. Pressure (e.g., 5 MPa to 10 MPa) is applied in the mold, and a fluid mold resin is charged into the mold. Then, the resin is heated and cured at a temperature of approximately 180° C. This forms the core substrate 12. To charge the molding resin, processes such as transfer molding, compression molding, injection molding, and the like may be used. The core substrate 12 may be formed by potting liquid resin or by applying paste resin in a printing process.

In the step shown in FIG. 3C, the support substrate 60 shown in FIG. 3B is removed from the core substrate 12. The through holes 12X that extend through the core substrate 12 in the thickness direction are then formed at certain locations in the core substrate 12. The through holes 12X may be formed, for example, through a laser process, a machine drilling process, a router process, a sandblasting process, and the like. The through holes 12X of the present example are formed from the upper surface 12A of the core substrate 12 in a laser process. This forms the core 10 including the semiconductor chip 11 and the core substrate 12 having the through holes 12X in each first region R1.

Figure 4A:
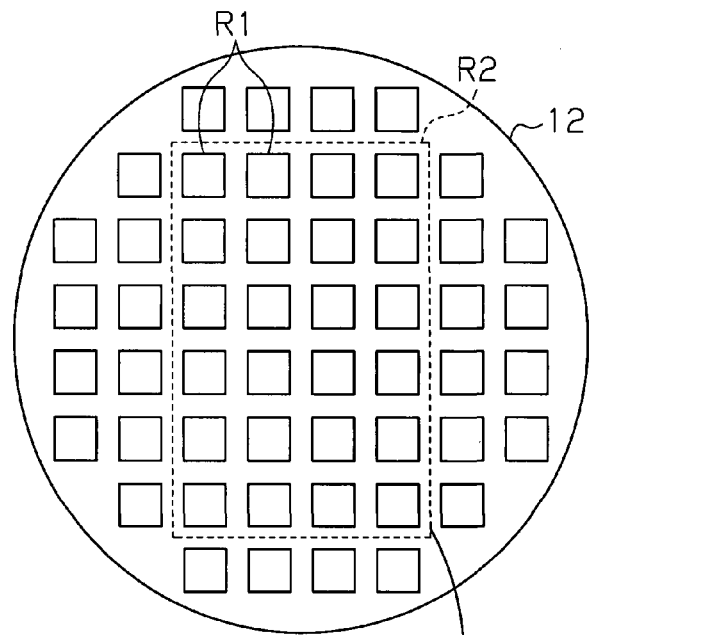
FIGS. 4A and 4B are schematic plan views illustrating one embodiment of a method for manufacturing the semiconductor package according to one embodiment.

In the step shown in FIG. 4A, a second region R2 including a certain number (e.g., 6×4) of first regions R1 is cut out from the core substrate 12. For example, the core substrate 12 is cut along a cutting line (see broken line) defining the second region R2 with a dicing blade to cut out the second region R2.

Figure 4B:
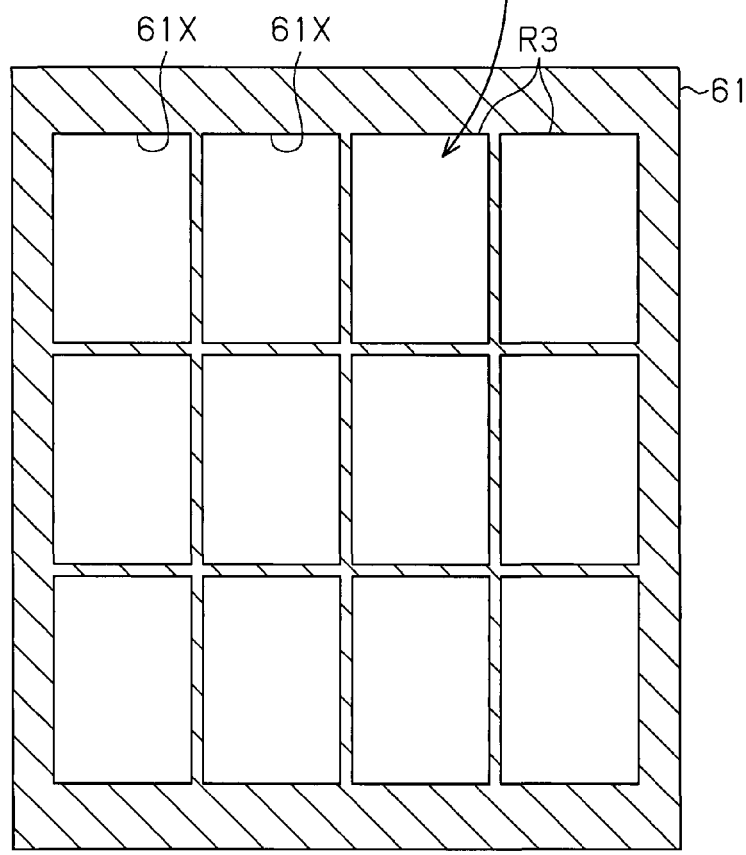

The second region R2 that is cut out is rearranged on a batch substrate (hereinafter also simply referred to as "substrate") 61 shown in FIG. 4B. The substrate 61 includes rearranging regions R3, which are regions where the second region R2 are rearranged, in a matrix array (e.g., 3×4). The substrate 61 is tetragonal as viewed from above. The size of the substrate 61 may be, for example, approximately 510 mm×340 mm. In the substrate 61, the rearranging regions R3 are defined by forming through holes 61X in certain locations of a copper clad laminated (CCL) plate, for example.

As shown in FIG. 5A, a second region R2 is rearranged on each rearranging region R3 of the substrate 61. Specifically, as shown in FIG. 5B, each second region R2 is embedded in a rearranging region R3 of the substrate 61 defined by a through hole 61X. In other words, the substrate 61 serves as a frame embedding a large number of the second regions R2. When the second regions R2 are embedded in all of the rearranging regions R3, the substrate 61 includes three rows and four columns of second regions R2, each including six rows and four columns of the first regions R1, as shown in FIG. 5A.

The manufacturing steps of FIGS. 6 to 8 described below are performed with the second regions R2 supported by the substrate 61 (frame body). The structure of only one first region R1 is shown in FIGS. 6 to 8 to facilitate illustration.

In the step shown in FIG. 6A, a structure 72 in which a sheet-like insulating layer 71, which becomes the first insulating layer 21 and the second insulating layer 22, is adhered to a carrier 70, and a structure 75 in which a sheet-like insulating layer 74, which becomes the first insulating layer 21 and the third insulating layer 23, is adhered to a carrier 73 are prepared. A resin material having a content of the inorganic filler that is less than the core substrate 12 may be used as the material of the insulating layers 71 and 74. The insulating layers 71 and 74 that are used are in a B-stage state (half-cured state). The insulating layers 71 and 74 may have a thickness of, for example, approximately 35 μm to 70 μm. For example, copper foil may be used as the carriers 70 and 73 that carrying the insulating layers 71 and 74, respectively. The carriers 70 and 73 may have a thickness of, for example, approximately 50 μm to 70 μm.

In the step shown in FIG. 6A, the structure 72 is arranged over the upper surface 12A of the core substrate 12, and the structure 75 is arranged over the lower surface 12B of the core substrate 12. In this case, the structure 72 is arranged with the insulating layer 71 facing the lower side so that the insulating layer 71 faces the electrode pads 11P of the semiconductor chip 11. The structure 75 is arranged with the insulating layer 74 facing the upper side so that the insulating layer 74 faces the lower surface 12B of the core substrate 12. The core 10 and the structures 72, 75 are then heated and pressurized from two sides at a temperature of approximately 190° C. and 250° C. in a vacuum atmosphere. The insulating layers 71 and 74 are filled into the through holes 12X, and the electrode pad 11P is pressed into the insulating layer 71. Referring to FIG. 6B, the insulating layers 71 and 74 are then cured to form the first insulating layer 21 in the through holes 12X. Further, the second insulating layer 22 covering the upper surface 12A of the core substrate 12, the circuit forming surface 11A of the semiconductor chip 11, the electrode pad 11P and the upper surface of the first insulating layer 21 is formed. The third insulating layer 23 covering the lower surface 12B of the core substrate 12 and the lower surface of the first insulating layer 21 is also formed. The curing of the insulating layers 71 and 74 adheres the first to third insulating layers 21 to 23 (i.e., insulating layer 20) to the semiconductor chip 11 and the core substrate 12.

Subsequently, in the step shown in FIG. 6B, the carriers 70 and 73 (copper foils) shown in FIG. 6A are selectively removed from the insulating layer 20. For example, the carriers 70 and 73 may be selectively removed from the insulating layer 20 through wet etching using, for example, aqueous ferric chloride, aqueous copper chloride, ammonium persulfate aqueous solution, or the like.

In the step shown in FIG. 6C, the through holes 20X that extend through the insulating layer 20 in the thickness direction are formed in certain locations of the insulating layer 20. The through hole 20X can be formed, for example, through a laser process, a machine drilling process, and the like. The through holes 20X of the present example is formed from the upper surface 22A of the second insulating layer 22 in a laser process. In the present step, each through hole 20X is formed so that the hole wall surface of the corresponding through hole 12X of the core substrate 12 is not exposed from the insulating layer 20.

In the step shown in FIG. 6C, the via holes VH1 are formed in certain locations of the second insulating layer 22 to expose the upper surface of the electrode pads 11P formed on the circuit forming surface 11A of the semiconductor chip 11. The via holes VH1 may be formed through a laser process using, for example, $CO_2$ laser, or UV-YAG laser. Then, a desmear process is performed to remove resin smears from the via hole VH1. The desmear processing may be performed by through, for example, a permanganate process.

In the step shown in FIG. 7A, a seed layer 76 is formed to cover the entire surface of the insulating layer 20 including the hole wall surface of each through hole 20X and the hole wall surface of each via hole VH1. The seed layer 76 may be formed, for example, through an electroless plating process. For example, copper or copper alloy may be used as the material of the seed layer 76.

Here, the content of the inorganic filler that lowers the adhesiveness to the seed layer 76 (e.g., electroless copper plating film) is relatively small in the insulating layer 20. Thus, the seed layer 76 is adhered in a favorable manner to the insulating layer 20. Specifically, the content of the inorganic filler in the insulating layer 20 is less than the content of the inorganic filler in the core substrate 12. The adhering strength of the insulating layer 20 and the seed layer 76 is higher than the adhering strength of the core substrate 12 and the seed layer 76 of when the seed layer 76 is formed on the core substrate 12. Thus, compared to when forming the seed layer on the hole wall surface of each through hole 12X in the core substrate 12, the seed layer 76 is adhered in a more favorable manner to the hole wall surface of the through hole 20X of the insulating layer 20. This avoids a problem in which the seed layer 76 is not formed on portions of the hole wall surface of each through hole 20X, and the seed layer 76 is formed over the entire hole wall surface of each through hole 20X in the insulating layer 20.

Then, in the step shown in FIG. 7B, a resist layer 77, which includes openings 77X corresponding to the patterns of the first wiring layer 32 and the second wiring layer 33 (see FIG. 1B), is formed on the seed layer 76. For example, a dry film resist (DFR) may be used as the resist layer 77. The resist layer 77 having the openings 77X may be formed in a photolithography process, for example.

The wiring layer 30 is then formed, as shown in FIG. 7C, through an electrolytic plating process that uses the seed layer 76 as the power supplying layer. Specifically, a metal plated layer such as copper and the like is filled in each opening 77X of the resist layer 77 including the corresponding via hole VH1 to form the first wiring layer 32 and the second wiring layer 33. Further, the through via 31, which is a plated through hole via, is formed in each through hole 20X by an electrolytic plating process that uses the seed layer 76 as a power supplying layer.

In the step shown in FIG. 7C, after removing the resist layer 77 shown in FIG. 7B, the unnecessary seed layer 76 is etched and removed. In the steps shown in FIGS. 7A to 7C, the wiring layer 30 (through via 31, first wiring layer 32, and second wiring layer 33) is formed on the insulating layer 20 (first to third insulating layers 21 to 23). In this manner, the wiring layer 30 is formed by performing a semi-additive process. The wiring layer 30 does not necessarily have to be formed in a semi-additive process, and may be formed by various types of wiring forming processes, such as a subtractive process.

In the step shown in FIG. 8A, the solder resist layer 41 is formed on the second insulating layer 22 to cover the first wiring layer 32. Then, the solder resist layer 41 is exposed and developed by the photolithography process to form each opening 41X. This exposes portions of the wiring pattern 32B from the openings 41X of the solder resist layer 41 as the connection pads 32P. The solder resist layer 42 is formed below the third insulating layer 23 to cover the second wiring layer 33. Then the solder resist layer 42 is exposed and developed by the photolithography method to form the openings 42X. Portions of the second wiring layer 33 are exposed from the openings 42X of the solder resist layer 42 as the external connection pads 33P. For example, the metal layer in which the Ni layer and the Au layer are stacked in this order may be formed on the connection pad 32P and the external connection pad 33P when required. The metal layer may be formed in an electroless plating process, for example.

In the step shown in FIG. 8B, the external connection terminals 50 are formed on the external connection pads 33P. For example, after appropriately applying flux to the external connection pads 33P, the external connection terminals 50 (e.g., solder balls) are arranged on the external connection pads 33P. A reflow process in then performed at the temperature of approximately 240° C. to 260° C. to fix the external connection terminals 50. Then, the surface is cleaned to remove the flux.

The steps described above manufacture the structure corresponding to the semiconductor package 1 in each first region R1 (see FIG. 3).

A method for manufacturing the semiconductor device 2 will now be described.

First, as shown in FIG. 8B, the solder ball 51 is formed on each connection pad 32P of the semiconductor package 1. The solder ball 51 may be formed, for example, by applying a solder paste or by mounting a solder ball. Subsequently, in the step shown in FIG. 8C, the semiconductor chip 3 including the bumps 4 is positioned above the connection pads 32P, and the solder balls 51 and the bumps 4 are fused to electrically connect the semiconductor chip 3 and the connection pad 32P (flip-chip-joining).

Then, the region (first region R1) corresponding to each semiconductor device 2 is cut out. This obtains a large number of the semiconductor devices 2 shown in FIG. 2. The structure may be cut at the region corresponding to the each semiconductor package 1 when the structure corresponding to the semiconductor package 1 is manufactured in each first region R1 to obtain the semiconductor package 1 shown in FIG. 1. In this case, the solder balls 51 are formed on the connection pads 32P of each semiconductor package 1. Then, the semiconductor chip 3 is flip-flop joined to the semiconductor package 1.

The above embodiment has the following advantages.

(1) The hole wall surface of each through hole 12X in the core substrate 12 is covered with the insulating layer 20 that has higher adhesiveness to the metal film (e.g., electroless plating film) than the core substrate 12. The through hole 20X having a smaller diameter than the through hole 12X is formed in the insulating layer 20, and the through via 31 is formed to cover the hole wall surface of the through hole 20X. In the insulating layer 20, the content of the inorganic filler that lowers the adhesiveness to the electroless plating film is less than the core substrate 12, and the grain diameter of the inorganic filler is also smaller than in the core substrate 12. Thus, when the through via 31 is formed through the electroless plating process and the electrolytic plating process, a high-quality through via 31 free from defects such as void is formed in a desirable manner. This increases the reliability of the electrical connection between the upper side and the lower side of the core substrate 12.

(2) For example, to form a through via in each through hole 12X of the core substrate 12 when a silicon substrate is used as the core substrate 12, in a known method, a metal plate is adhered to the lower surface 12B of the core substrate 12, and an electrolytic plating process is then performed using the metal plate as the power supplying layer to deposit and develop the metal plated layer in the through hole 12X, and the through hole 12X is filled with the metal plated layer. With such method, however, the plating is developed from the metal plate adhered to the lower surface 12B of the core substrate 12. Thus, there is no chemical adherence between the hole wall surface of each through hole 12X and the metal plated layer.

In contrast, in the present embodiment, the through via 31 is formed in each through hole 20X through an electrolytic plating process using the seed layer 76 as the power supplying layer after forming the electroless plating film (seed layer 76) on the hole wall surface of each through hole 20X. Thus, the through via 31 is chemically adhered to the hole wall surface of the through hole 20X. This suppresses separation of the through vias 31 from the through holes 20X and improves the reliability of the electrical connection between the upper side and the lower side of the core substrate 12.

(3) In one referential example in which the core substrate 12 is a silicon substrate, the unnecessary metal plated layer needs to be removed through chemical mechanical polishing (CMP) and the like after the electrolytic plating. In contrast, in the present embodiment, the through via 31 is formed in each through hole 20X in an electrolytic plating process using the seed layer 76 as the power supplying layer after forming the electroless plating film (seed layer 76) on the hole wall surface of each through hole 20X. Thus, subsequent processing such as CMP and the like is not necessary.

(4) The seed layer 76 formed on the hole wall surface of the through hole 20X is used as the power supplying layer of the electrolytic plating. Thus, the through vias 31 are formed in a shorter period of time than when depositing and developing the metal plated layer from the metal plate formed on the lower surface 12B of the core substrate 12.

(5) In one referential example, the via holes VH1 exposing the upper surface of the electrode pads 11P on the semiconductor chip 11 is formed in the second insulating layer 22, which is formed on the upper surface 12A of the core substrate 12. Thus, the second insulating layer 22 is may be thin to suppress damages of the electrode pad 11P. More specifically, when forming the via holes VH1 through the laser process, the electrode pads 11P may be damaged by a laser beam if the output of the laser beam is high. Thus, to allow for formation of the via holes VH1 even if the output of the laser is low, the second insulating layer 22 formed on the upper surface 12A of the core substrate 12 may be thin. Here, when the angle between the upper surface 12A of the core substrate 12 and the hole wall surface of the through hole 12X is close to 90 degrees in cross-section, the open end of each through hole 12X in the core substrate 12 may easily be exposed from the insulating layer 20 when forming each through hole 20X of the insulating layer 20 through a laser process.

The present embodiment differs from the referential example in that each through hole 12X of the core substrate 12 is tapered and has a diameter that decreases from the upper surface 12A of the core substrate 12 on the electrode pad 11P of the semiconductor chip 11 toward the central part in the thickness direction of the core substrate 12. Thus, even if each through hole 20X of the insulating layer 20 is formed from the upper surface 22A of the second insulating layer 22 in a laser process, the hole wall surface of the through hole 20X is formed along the hole wall surface of the through hole 12X. This suppresses exposure of the open end of each through hole 12X in the core substrate 12 from the insulating layer 20.

It should be apparent to those skilled in the art that the present invention may be embodied in many other specific forms without departing from the spirit or scope of the invention. Particularly, it should be understood that the present invention may be embodied in the following forms.

In the embodiment described above, the through via 31, which is the plated through hole via, is formed in each through hole 20X of the insulating layer 20. Instead, for example, as shown in FIG. 9D, a through via 31A may be filled in each through hole 20X of the insulating layer 20. In this case, a semiconductor package 1A may be manufactured in the following manner.

First, in the step shown in FIG. 9A, a structure similar to the structure shown in FIG. 7B is formed through the manufacturing steps shown in FIGS. 3A to 7B. As shown in FIG. 9B, each through hole 20X is filled with a metal plated layer such as copper and the like to form the through via 31A. Further, each opening 77X of the resist layer 77 including the via hole VH1 is filled with a metal plated layer such as copper and the like to form the first wiring layer 32 and the second wiring layer 33 through an electrolytic plating process using the seed layer 76 as the power supplying layer. In this case, one end face (e.g., upper end face) of the through via 31A is electrically connected to the wiring pattern 32B of the first wiring layer 32, and the other end face (e.g., lower end face) of the through via 31A is electrically connected to the second wiring layer 33.

In the step shown in FIG. 9C, the solder resist layer 41, which includes the openings 41X that expose portions of the wiring pattern 32B of the first wiring layer 32 as the connection pads 32P, is formed on the upper surface 22A of the second insulating layer 22. The solder resist layer 42, which includes the openings 42X that expose portions of the second wiring layer 33 as the external connection pads 33, is formed on the lower surface 23B of the third insulating layer 23. Then, as shown in FIG. 9D, the external connection terminals 50 is formed on the external connection pads 33P to manufacture the semiconductor package 1A.

In the embodiment described above, the second insulating layer 22, which covers the upper surface 12A of the core substrate 12, and the third insulating layer 23, which covers the lower surface 12B of the core substrate 12, are formed from the same material. Instead, as shown in FIG. 10C, for example, the second insulating layer 22, which covers the upper surface 12A of the core substrate 12, and the third insulating layer 24, which covers the lower surface 12B of the core substrate 12, may be formed from different materials. For example, in a semiconductor package 1B shown in FIG. 10C, the second insulating layer 22 is an insulating layer that contains a reinforcement material, and the third insulating layer 24 is an insulating layer that does not contain a reinforcement material. The third insulating layer 24 is an insulating layer having a higher mechanical strength (rigidity, hardness, etc.) than the other second insulating layer 22. The material of the third insulating layer 24 may be an insulative resin containing a reinforcement material in which epoxy or polyimide thermosetting resin is impregnated in a woven cloth or a non-woven cloth of glass, aramid, or liquid crystal polymer (LCP) fiber may be used. Further, the material of the third insulating layer 24 is preferably an insulative resin in which the coefficient of thermal expansion of the third insulating layer 24 is adjusted to be closer to the coefficient of thermal expansion of the semiconductor chip 11 than the coefficient of thermal expansion of the second insulating layer 22. In other words, an insulative resin in which the coefficient of thermal expansion of the third insulating layer 24 is adjusted to be lower than the coefficient of thermal expansion of the second insulating layer 22 is preferable as the material of the third insulating layer 24. For example, the coefficient of thermal expansion of the insulating layer 24 is set to approximately 18 ppm/° C. to 30 ppm/° C. A resin material with a content of the inorganic filler that is less than the core substrate 12 may be used as the material of the resin portion in the third insulating layer 24.

The third insulating layer 24 may have a thickness of, for example, approximately 70 μm to 100 μm. In other words, the third insulating layer 24 is thicker than when using an insulative resin that does not contain a reinforcement material as the third insulating layer 24. In this case, the design rule is more lenient compared to the side (e.g., connection pad 32P) on which the other semiconductor chips 3 (see FIG. 2) are mounted and allows the pitch for the external connection pads 33P on the side of the external connection terminals 50 to be wider than the connection pads 32P. This easily allows for the third insulating layer 24 to be thick. In other words, if the second insulating layer 22, which is formed on the side the other semiconductor chips 3 are mounted, is thick, the via holes VH1 formed in the second insulating layer 22 becomes deep and the diameter at the open end (diameter on the solder resist 41 side) also becomes large. Thus, the pitch of the connection pads 32P cannot be narrowed.

In this manner, in a semiconductor package 1B, portions of the insulating layer formed on the two surfaces of the core substrate 12 include the insulating layer (third insulating layer 23) containing the reinforcement material. This increases the rigidity of the third insulating layer 24 and suppresses warping of the semiconductor package 1B. In particular, since the third insulating layer 24 formed over the lower surface 12B of the core substrate 12 is the insulating layer containing the reinforcement material, warping of the entire semiconductor package 1B may be effectively suppressed by the third insulating layer 24 containing the reinforcement material even if the semiconductor chip 11 is embedded toward the upper surface 12A of the core substrate 12.

A method for manufacturing the semiconductor package 1B will now be described.

Figure 10A:
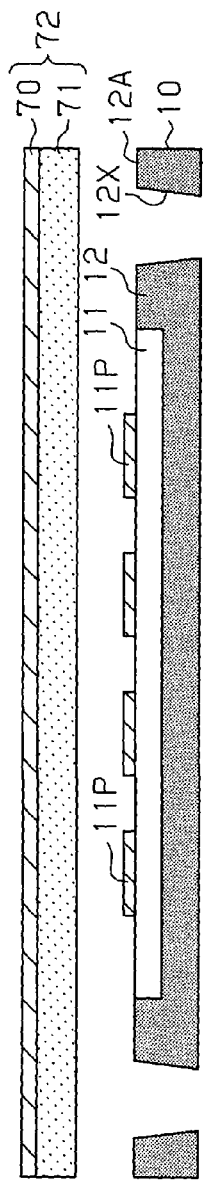
FIGS. 10A to 10C are schematic cross-sectional views illustrating a second modification of a method for manufacturing a semiconductor package.

First, in the step shown in FIG. 10A, the core 10, which includes the semiconductor chip 11 and the core substrate 12 embedding the semiconductor chip 11, is formed through the manufacturing steps shown in FIGS. 3A to 5B. The structure 72, in which the sheet-like insulating layer 71 is adhered to the carrier 70, and a structure 79, in which a sheet-like insulating layer 78 is adhered to the carrier 73, are then prepared. For example, a resin material in which an uncured thermosetting resin is impregnated in a reinforcement material such as a woven cloth or a non-woven cloth of glass, aramid, and LCP fiber, and the like may be used as the material of the insulating layer 78. The insulating layer 78 is in the B-stage state. The insulating layer 71 may have a thickness of, for example, approximately 35 µm to 70 µm, and the insulating layer 78 may have a thickness of, for example, approximately 75 µm to 105 µm.

Figure 10B:
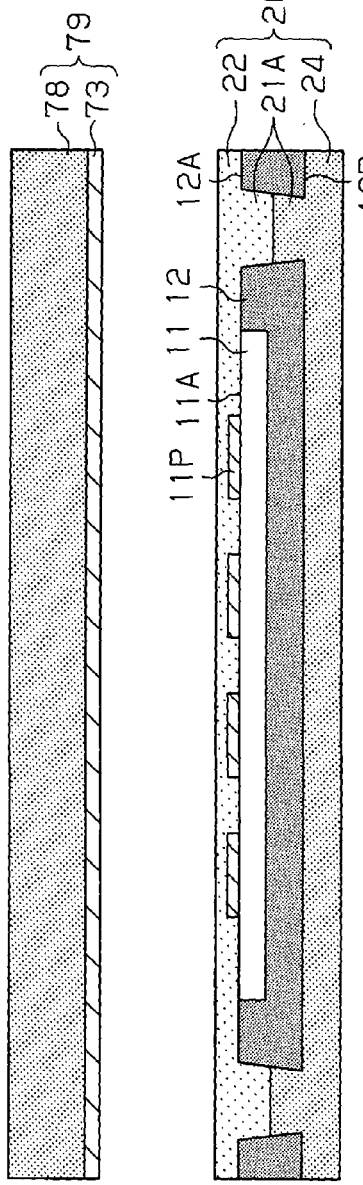
Figure 10C:
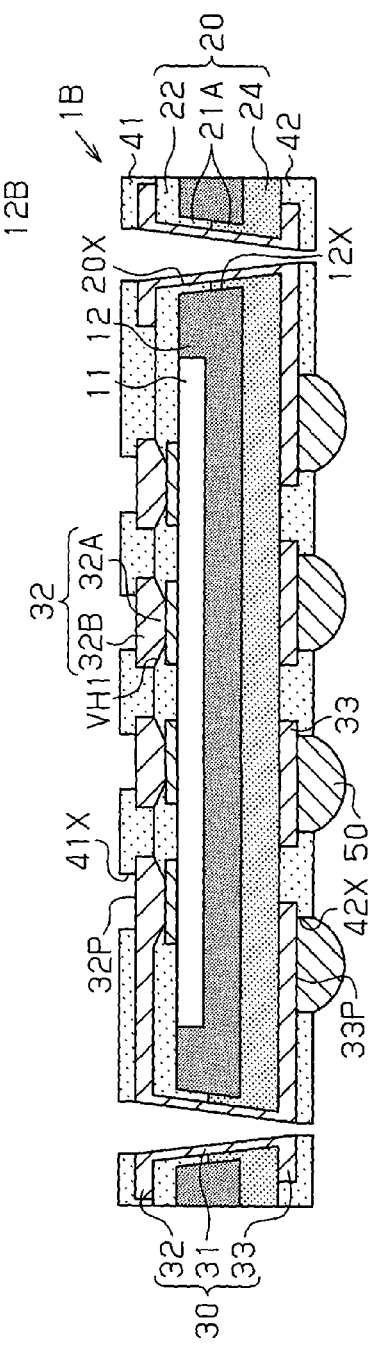

In the step shown in FIG. 10A, the structure 72 is arranged over the upper surface 12A of the core substrate 12, and the structure 79 is arranged over the lower surface 12B of the core substrate 12. In this case, the structure 72 is arranged with the insulating layer 71 facing the lower side so that the insulating layer 71 faces the electrode pad 11P of the semiconductor chip 11. The structure 79 is arranged with the insulating layer 78 facing the upper side so that the insulating layer 78 faces the lower surface 12B of the core substrate 12. The core 10 and the structures 72, 79 are then heated and pressurized from two sides at a temperature of approximately 190° C. and 250° C. in a vacuum atmosphere. This fills the insulating layers 71 and 78 in the through hole 12X, and the electrode pads 11P are pressed into the insulating layer 71. In this case, each through hole 12X is filled with the resin portion (uncured thermosetting resin) in the insulating layer 78. The insulating layers 71 and 78 are then cured. As shown in FIG. 10B, this forms the first insulating layer 21A in the through hole 12X, and forms the second insulating layer 22 that covers the upper surface 12A of the core substrate 12, the circuit forming surface 11A of the semiconductor chip 11, the electrode pad 11P, and the upper surface of the first insulating layer 21A. The third insulating layer 24 that covers the lower surface 12B of the core substrate 12 and the lower surface of the first insulating layer 21A is also formed. Further, the curing of the insulating layers 71 and 78 adheres the first to third insulating layers 21A, 22, and 24 (i.e., insulating layer 20) to the semiconductor chip 11 and the core substrate 12. Then, wet etching is performed to remove the carriers 70 and 73.

Then, in the step shown in FIG. 10C, the through holes 20X that extend through the insulating layer 20 in the thickness direction is formed at certain locations of the insulating layer 20. The through holes 20X may be formed, for example, by a laser process, a machine drilling process, and the like. In this step, each through holes 20X is formed so that the hole wall surface of the corresponding through hole 12X in the core substrate 12 is not exposed from the insulating layer 20. Then, the steps shown in FIGS. 6C to 8A are performed to form the wiring layer 30, which includes the through vias 31 formed in the through holes 20X, the first wiring layer 32, which is stacked on the second insulating layer 22, and the second wiring layer 33, which is formed below the third insulating layer 24. Further, the solder resist layers 41 and 42 are formed. The external connection terminals 50 are then formed on the external connection pads 33P to manufacture the semiconductor package 1B.

In a modification shown in FIG. 10, the third insulating layer containing the reinforcement material is thicker than the second insulating layer 22. Instead, the thicknesses of the second insulating layer 22, which does not contain the reinforcement material, may have a thickness that differs from the third insulating layer 23. For example, the third insulating layer 23 formed over the lower surface 12B of the core substrate 12 may be thicker than the second insulating layer 22 formed over the upper surface 12A of the core substrate 12. By setting the thicknesses of the second and third insulating layers 22 and 23 in such a manner, warping over the entire semiconductor package 1 may be effectively suppressed even if the semiconductor chip 11 is embedded toward the upper surface 12A in the core substrate 12.

In the modification shown in FIG. 10, the third insulating layer 24 containing the reinforcement material is thicker than the second insulating layer 22. Instead, the insulating layers 26 and 27 containing the reinforcement material may have the same thickness as the second insulating layer 22, which is formed over the upper surface 12A of the core substrate 12 in semiconductor packages 1C and 1D manufactured through the manufacturing method shown in FIGS. 11 and 12, for example.

A method for manufacturing the semiconductor package 1C will now be described.

First, in the step shown in FIG. 11A, the core 10 including the semiconductor chip 11 and the core substrate 12 embedding the semiconductor chip 11 is formed through the steps shown in FIGS. 3A to 5B. The structure 72, in which the sheet-like insulating layer 71 is adhered to the carrier 70, and a structure 82, in which a sheet-like insulating layer 80 and a sheet-like insulating layer 81 are stacked in order on the carrier 73 (i.e., structure in which the insulating layer of two-layer structure is adhered to the carrier 73), are then prepared. A resin material in which the content of the inorganic filler is less than the core substrate 12 may be used as the material of the insulating layers 71 and 81. For example, a resin material in which an uncured thermosetting resin is impregnated in a reinforcement material such as a woven cloth or a non-woven cloth of glass, aramid, and LCP fiber, and the like may be used as the material of the insulating layer

80. The insulating layers 71, 80, and 81 are in the B-stage state. The insulating layer 71 has a thickness of, for example, approximately 35 µm to 70 µm, and the insulating layer 80 has a thickness of, for example, approximately 35 µm to 70 µm. The insulating layer 81 may be thinner than the insulating layers 71 and 80. Specifically, the insulating layer 81 may have a thickness of, for example, approximately 5 µm to 10 µm.

In the step shown in FIG. 11A, the structure 72 is arranged over the upper surface 12A of the core substrate 12, and the structure 82 is arranged over the lower surface 12B of the core substrate 12. In this case, the structure 72 is arranged with the insulating layer 71 facing the lower side so that the insulating layer 71 faces the electrode pad 11P of the semiconductor chip 11. The structure 82 is arranged with the insulating layer 81 facing the upper side so that the insulating layer 81 faces the lower surface 12B of the core substrate 12. The core 10 and the structures 72, 82 are then heated and pressurized from two sides at the temperature of approximately 190° C. to 250° C. in a vacuum atmosphere. This fills the insulating layers 71 and 81 in the through holes 12X, and presses the electrode pad 11P into the insulating layer 71. The insulating layers 71, 80, and 81 are then cured. As shown in FIG. 11B, this forms the first insulating layer 21 filled in the through holes 12X, the second insulating layer 22 that covers the upper surface 12A of the core substrate 12, the circuit forming surface 11A of the semiconductor chip 11, the electrode pad 11P, and the upper surface of the first insulating layer 21. An insulating layer 25 that covers the lower surface 12B and the lower surface of the first insulating layer 21, and an insulating layer 26 containing the reinforcement material that covers the insulating layer 25 are formed over the lower surface 12B of the core substrate 12. The curing of the insulating layers 71, 80, and 81 forms the insulating layers 21, 22, 25, and 26 (i.e., insulating layer 20) adhered to the semiconductor chip 11 and the core substrate 12 accompanying. Then, wet etching is performed to remove the carriers 70 and 73.

In this manner, the insulating layer thermo-compression bonded to the lower surface 12B of the core substrate 12 is a two-layer structure including the thin insulating layer 25, which does not contain a reinforcement material, and the insulating layer 26, which contains a reinforcement material. This allows the insulating layer 26 containing the reinforcement material having the same thickness as the second insulating layer 22 to be formed over the lower surface 12B of the core substrate 12.

In the step shown in FIG. 11C, the through holes 20X that extend through the insulating layer 20 in the thickness direction is formed at certain locations of the insulating layer 20. Then, the steps shown in FIGS. 6C to 8A are performed to form the wiring layer 30 including the through vias 31 formed in the through holes 20X, the first wiring layer 32 stacked on the second insulating layer 22, and the second wiring layer 33 stacked on the insulating layer 26. Further, the solder resist layers 41 and 42 are formed. The external connection terminals 50 is then formed on the external connection pads 33P to manufacture the semiconductor package 1C.

A method for manufacturing the semiconductor package 1D will now be described.

Figure 12A:
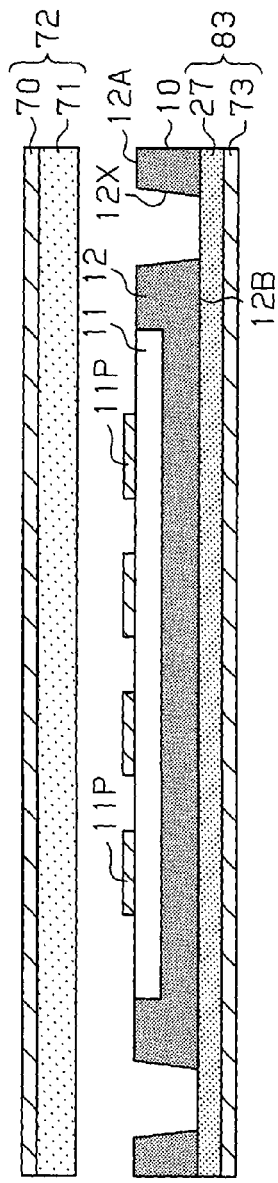
FIGS. 12A to 12C are schematic cross-sectional views illustrating a fourth modification of a method for manufacturing a semiconductor package.

First, in the step shown in FIG. 12A, the core 10 including the semiconductor chip 11 and the core substrate 12 embedding the semiconductor chip 11 is formed through the steps shown in FIGS. 3A to 5B. A structure 83 in which a sheet-like insulating layer 27 is adhered to the carrier 73 is then prepared. For example, a resin material in which an uncured thermosetting resin is impregnated in a reinforcement material such as a woven cloth or a non-woven cloth of glass, aramid, and LCP fiber, and the like may be used as the material of the insulating layer 27. The insulating layer 27 used is in the B-stage state. The insulating layer 27 has a thickness of, for example, 30 µm to 65 µm. The structure 83 is arranged over the lower surface 12B of the core substrate 12 with the insulating layer 27 facing the upper side so that the insulating layer 27 faces the lower surface 12B of the core substrate 12. The sheet-like structure 83 is then laminated with the lower surface 12B of the core substrate 12 through thermo-compression bonding. The insulating layer 27 is then cured under a temperature atmosphere of approximately 150° C. The curing of the insulating layer 27 adheres the insulating layer 27 containing the reinforcement material to the lower surface 12B of the core substrate 12.

Figure 12B:
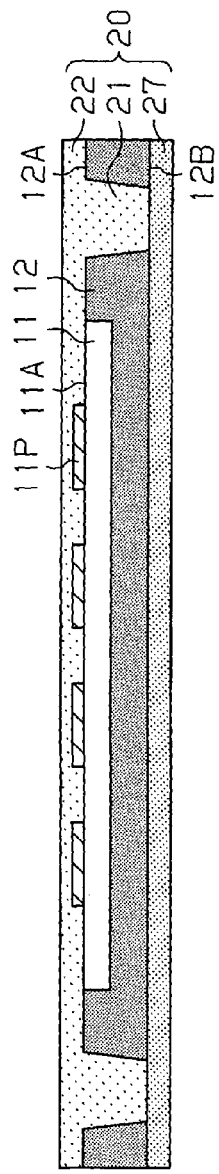

Further, in the step shown in FIG. 12A, the structure 72 in which the sheet-like insulating layer 71 is adhered to the carrier 70 is prepared. The structure 72 is arranged over the upper surface 12A of the core substrate 12 with the insulating layer 71 facing the lower side so that the insulating layer 71 faces the electrode pad 11P of the semiconductor chip 11. The core 10 adhered with the structure 83 and the structure 72 are then heated and pressurized from two sides at a temperature of approximately 190° C. to 250° C. in a vacuum atmosphere. This fills the insulating layer 71 into the through holes 12X, and presses the electrode pads 11P into the insulating layer 71. As shown in FIG. 12B, the curing of the insulating layer 71 forms the first insulating layer 21, which is filled in the through holes 12X, and the second insulating layer 22, which covers the upper surface 12A of the core substrate 12, the circuit forming surface 11A of the semiconductor chip 11, the electrode pads 11P, and the upper surface of the first insulating layer 21. The curing of the insulating layer 71 adheres the insulating layers 21 and 22 to the semiconductor chip 11 and the core substrate 12. Then, wet etching is performed to remove the carriers 70 and 73.

In this manner, the insulating layer 27, which contains a reinforcement material and has the same thickness as the second insulating layer 22, may be formed over the lower surface 12B of the core substrate 12 by curing the insulating layer 27, which contains a reinforcement material and is formed on the lower surface 12B of the core substrate 12, and then filling the through holes 12X with the insulating layer 71, which does not contain the reinforcement material, from the upper surface 12A of the core substrate 12.

Figure 12C:
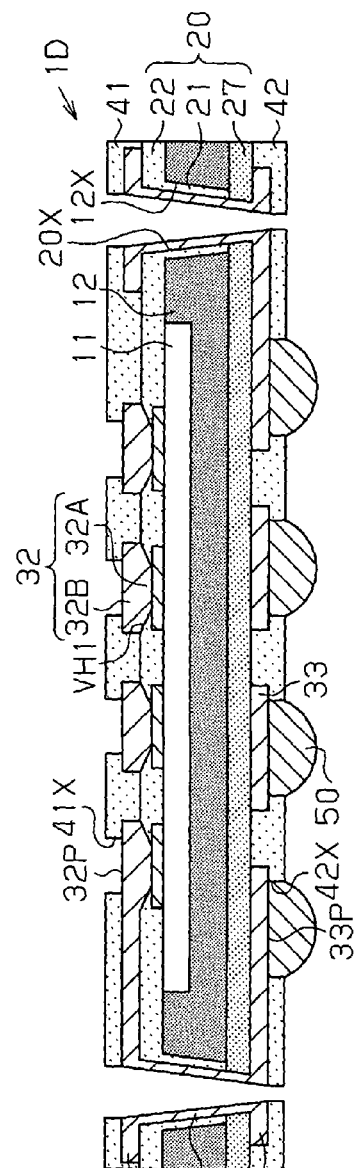

In the step shown in FIG. 12C, the through holes 20X that extend through the insulating layer 20 in the thickness direction is formed at certain locations of the insulating layer 20. Then, the manufacturing steps shown in FIGS. 6C to 8A are performed to form the wiring layer 30 including the through vias 31 in the through holes 20X, the first wiring layer 32 stacked on the second insulating layer 22, and the second wiring layer 33 stacked on the insulating layer 27. Further, the solder resist layers 41 and 42 are formed. The external connection terminals 50 are then formed on the external connection pads 33P to manufacture the semiconductor package 1D.

As shown in FIG. 13C, an n number (n is an integer greater than or equal to one, an n is one in FIG. 13C) of interlayer insulating layer 84 and a wiring layer 85 may be formed on the first wiring layer 32 formed over the upper surface 12A of the core substrate 12. The interlayer insulating layer 84 and the wiring layer 85 may be formed, for example, through a buildup process. More specifically, the manufacturing steps shown in FIGS. 9A and 9B are performed in the step shown in FIG. 13A to form the first wiring layer 32 on the upper surface 22A of the second insulating layer 22, the second wiring layer 33 on the lower surface 23B of the third insulating layer 23, and the through vias 31 that are filled in the through hole 20X and electrically connect the first wiring layer 32 and the second wiring layer 33. Then, the interlayer insulating layer 84 is formed to cover the first wiring layer 32 on the upper surface 22A of the second insulating layer 22. The interlayer insulating layer 84 may be formed, for example, by laminating a resin film to the upper surface 22A of the second insulating layer 22, and then performing thermal processing at a temperature of approximately 130° C. to 150° C. to cure the resin film while pressing the resin film. A material similar to the second insulating layer 22 may be used as the material of the interlayer insulating layer 84. In other words, for example, a buildup resin may be used as the material of the interlayer insulating layer 84. Via holes VH2 are then formed at predetermined locations of the interlayer insulating layer 84 to expose the upper surface of the wiring pattern 32B of the first wiring layer 32. The via hole VH2 may be formed, for example, by the laser process of $CO_2$ laser, UV-YAG laser, and the like. When the interlayer insulating layer 84 is formed using a photosensitive resin, the required via hole VH2 may be formed through a photolithography process, for example.

Then, when the via holes VH2 are formed through a laser process, a desmear process is performed to remove resin smears from the via holes VH2.

In the step shown in FIG. 13B, a via conductor is filled in the via hole VH2 to form a via wire 85A, and a wiring pattern 85B electrically connected to the first wiring layer 32 by way of the via wire 85A is formed on the interlayer insulating layer 84. The wiring layer 85 including the via wire 85A and the wiring pattern 85B may be formed using various types of wiring forming methods such as semi-additive method and subtractive method, for example.

In the step shown in FIG. 13C, a solder resist layer 41A is formed on the interlayer insulating layer 84. The solder resist layer 41A includes the openings 41X for exposing, as connection pads 85P, portions of the wiring pattern 85B of the outermost wiring layer (e.g., wiring layer 85) from the n number of wiring layers stacked on the first wiring layer 32. Further, the solder resist layer 42 is formed on the lower surface 23B of the third insulating layer 23. The solder resist layer 42 includes the openings 42X for exposing, as the external connection pads 33P, portions of the second wiring layer 33. Then, the external connection terminals 50 are formed on the external connection pads 33P to manufacture a semiconductor package 1E.

Among the n number of interlayer insulating layers, one or more interlayer insulating layer may be formed as an insulating layer containing the reinforcement material. In the modification described above, the through vias 31A that fill the through hole 20X are formed. Instead, the through via 31, which is a plated through hole via, may be formed in each through hole 20X.

In the same manner, an m number of (m is an integer greater than or equal to one) interlayer insulating layers and a wiring layer may be formed on the second wiring layer 33 formed over the lower surface 12B of the core substrate 12. In this case, among the m number of interlayer insulating layers, one or more interlayer insulating layer may be formed as an insulating layer containing a reinforcement material.

Figure 14A:
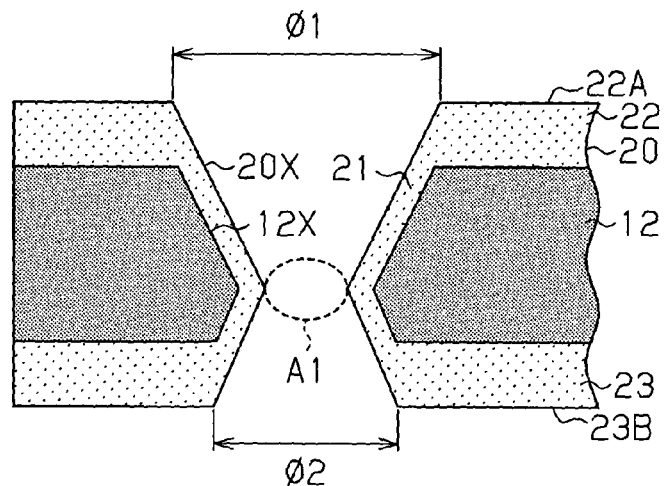
FIGS. 14A to 14C are schematic cross-sectional views illustrating a further modification of a method for manufacturing a semiconductor package.

In the embodiment described above, the through holes 12X and 20X have a generally reverse trapezoidal cross-section. However, the cross-sectional shape of the through holes 12X and 20X is not limited. For example, as shown in FIG. 14A, the through holes 12X and 20X may have a hourglass-shaped cross-section in which an intermediate portion in the thickness direction of the through holes 12X and 20X defines a most constricted portion 1A (portion where the inner diameter is the smallest). Specifically, each through hole 12X has an a hourglass-shaped cross-section in which the opening diameter increases from the intermediate position in the thickness direction of the core substrate 12 toward the open ends. Each through hole 20X has an hourglass-shaped cross-section in which the opening diameter increases from the intermediate position in the thickness direction of the insulating layer 20 toward the open ends. If the through hole 20X is hourglass-shaped, a metal plated layer free from defects such as void may be formed in the through hole 20X when forming the through vias 31A filling the through hole 20X. More specifically, when filling the metal plated layer in the through hole 20X through an electrolytic plating process, the through hole 20X may be closed from the intermediate portion (most constricted portion A1) in the thickness direction if the through hole 20X is a hourglass-shaped hole. Further, the metal plated layer is filled from the closed portion toward the upper side and the lower side. Thus, the metal plated layer (i.e., through via 31A) may be formed without defects such as voids in each through hole 20X. This improves the reliability of the electrical connection between the first wiring layer 32 and the second wiring layer 33 that are electrically connected by the through vias 31A. The through holes 12X and 20X with such shapes may be formed, for example, through the manufacturing method shown in FIG. 15.

Figure 15A:
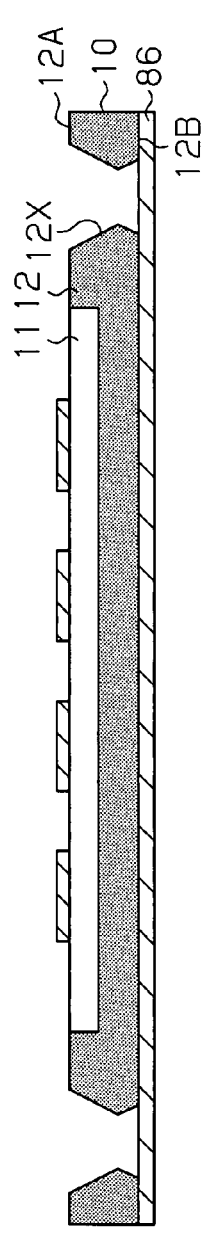
FIGS. 15A to 15C are schematic cross-sectional views illustrating a method for manufacturing the semiconductor package of FIG. 14A.

First, in the step shown in FIG. 15A, each through hole 12X is formed from the upper surface 12A of the core substrate 12 in a laser process with a metal plate 86 adhered to the lower surface 12B of the core substrate 12 embedding the semiconductor chip 11. In this case, a laser beam from the upper surface 12A of the core substrate 12 is reflected by the metal plate 86, and the core substrate 12 of the lower surface 12B is removed by the reflected laser beam. This forms the hourglass-shaped through hole 12X in which the most constricted portion is formed at the intermediate portion in the thickness direction of the core substrate 12. The hourglass-shaped through hole 12X may also be formed when the through hole 12X is formed from the upper and lower surfaces of the core substrate 12 by the laser process.

Figure 15B:
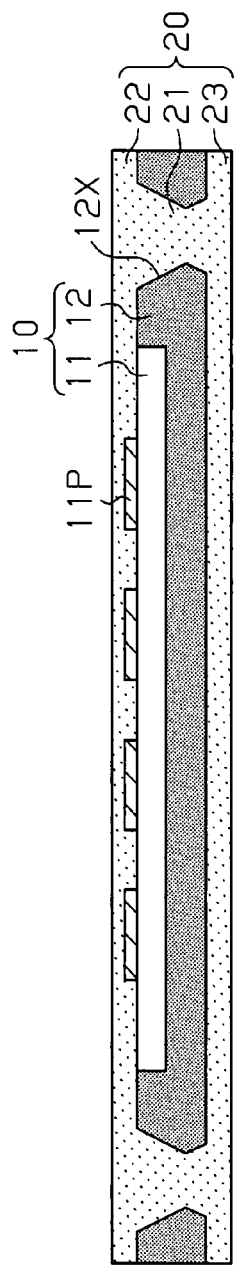

In the step shown in FIG. 15B, the metal plate 86 shown in FIG. 15A is removed by wet etching, and the like. The insulating layer 20 that covers the entire surface of the core 10 including the hole wall surface of each through hole 12X is then formed by the manufacturing steps similar to the steps shown in FIGS. 6A and 6B.

Figure 14B:
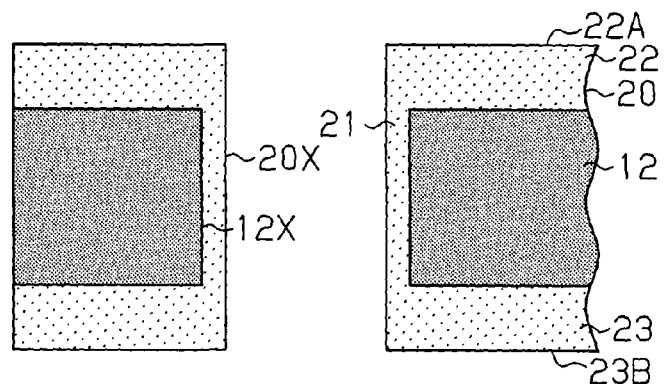
Figure 14C:
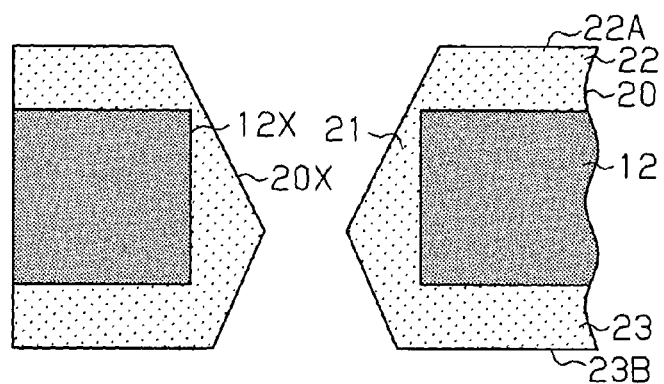
Figure 15C:
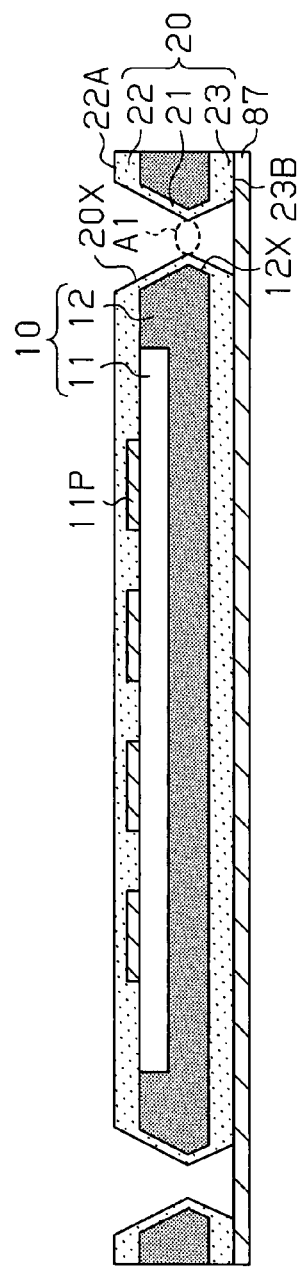

In the step shown in FIG. 15C, the through hole 20X is formed from the upper surface 22A side of the second insulating layer 22 by the laser process with a metal plate 87 adhered to the lower surface 23B of the third insulating layer 23. In this case, the laser beam from the upper surface 22A of the second insulating layer 22 is reflected by the metal plate 87, and the insulating layer 20 is removed from the side of the lower surface 23B of the third insulating layer 23 by the reflected laser. This forms each hourglass-shaped through hole 20X in which a most constricted portion A1 is formed at the intermediate portion in the thickness direction of the insulating layer 20. As shown in FIG. 14, the through hole 20X formed in such manner has a diameter $\Phi 1$ at the open end in the upper surface 22A of the second insulating layer 22 that is larger than the diameter $\Phi 2$ at the open end in the lower surface 23B of the third insulating layer 23.

Alternatively, as shown in FIG. 14B, the through holes 12X and 20X may have a generally rectangular (straight) cross-sectional shape.

In the embodiment described above, the cross-section of the through holes 12X and the cross-section of the through holes 20X have similar shapes. In other words, each through holes 12X has a generally reverse trapezoidal cross-section, and each through hole 20X has a generally reverse trapezoidal cross-section. Instead, the through holes 12X and the through holes 20X may have different cross-sectional shapes. For example, as shown in FIG. 14C, the through holes 12X may be linear, and the through holes 20X may by hourglass-shaped.

Figure 16:
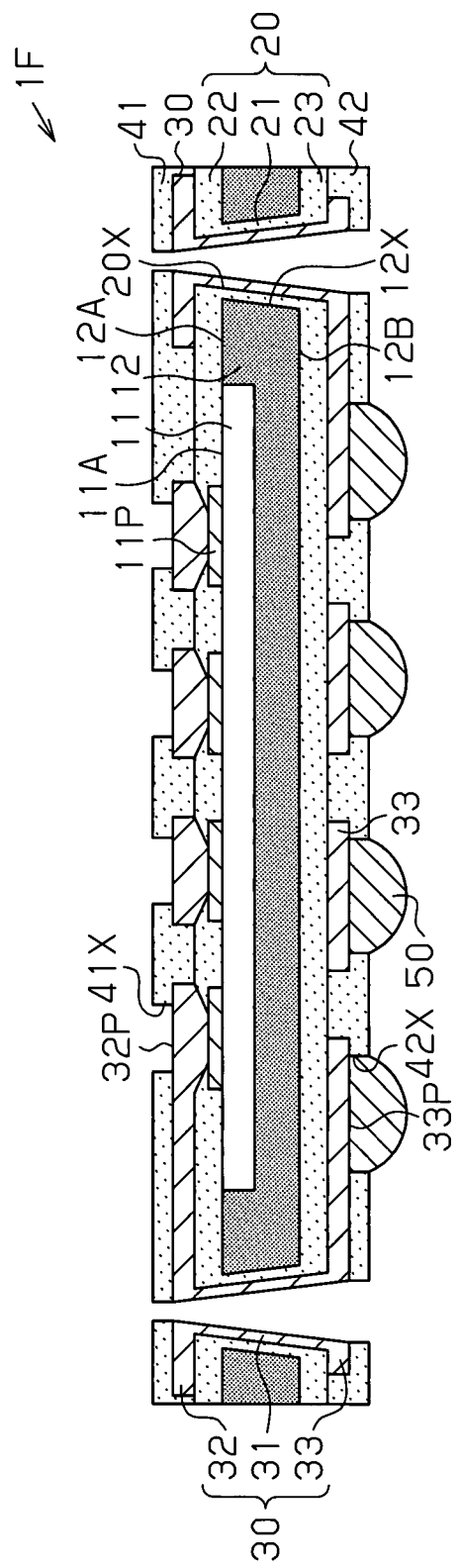
FIG. 16 is a schematic cross-sectional view showing a further modification of a semiconductor package.

In the embodiment described above, the through holes 12X and 20X have generally reverse trapezoidal cross-sections when the upper surface 12A of the core substrate 12 is the upper surface. Instead, for example, like in a semiconductor package 1F shown in FIG. 16, the through holes 12X and 20X may have generally trapezoidal cross-sectional shapes when the first surface 12A of the core substrate 12 is the upper surface. In other words, each through hole 12X may have a tapered shape in which the diameter increases from the upper surface 12A of the core substrate 12, which is substantially flush with the circuit forming surface 11A of the semiconductor chip 11, toward the lower surface 12B. Each through hole 20X may have a tapered shape in which the diameter increases from the upper surface 22A of the second insulating layer 22 toward the lower surface 23B of the third insulating layer 23.

In the embodiment described above, as shown in FIG. 17A, a single through hole 20X of the insulating layer 20 is formed in the interior of a single through hole 12X in the core substrate 12. Instead, for example, a plurality of (e.g., four) through holes 20X of the insulating layer 20 may be formed in the interior of a single through hole 12X of the core substrate 12, as shown in FIG. 17B. Thus, only the insulating layer 20 needs to be formed between the adjacent through holes 20X in the interior of the through hole 12X. This allows for the through holes 20X to be formed in a concentrated manner, and the pitch of the through holes 20X to be easily narrowed. The diameter of the through hole 12X in this case is, for example, approximately 250 µm to 350 µm.

The through holes 12X, 20X in the embodiment described above are not limited to circular shapes and may have, for example, a polygonal shape such as a tetragonal shape or a pentagonal shape, or may have an elliptical or semicircular shape.

In the embodiment described above, a plurality of through holes 12X and 20X are formed along each of the four sides forming the contour of the semiconductor package 1 (core substrate 12 and insulating layer 20). However, the arrangement of the through holes 12X and 20X as viewed from above is not particularly limited. For example, the through holes 12X and 20X may be arranged in a concentrated manner on only one of the four sides forming the contour of the semiconductor package 1 (core substrate 12 and insulating layer 20).

The third insulating layer 23 in the embodiment described above may be omitted. In this case, the second wiring layer 33 is formed on the lower surface 12B of the core substrate 12.

In the embodiment described above, the external connection terminals 50, which are used when connected to the motherboard and the like, is connected to the external connection pads 33P. Instead, the external connection pads 33 may be used for electrically connection with another semiconductor chip or semiconductor package like the connection pads 32P.

The external connection terminal 50 may be omitted from the semiconductor package 1 in the embodiment described above.

In the embodiment described above, the circuit forming surface 11A of the semiconductor chip 11 and the electrode pad 11P formed on the circuit forming surface 11A are exposed from the core substrate 12. Instead, for example, the circuit forming surface 11A of the semiconductor chip 11 may be embedded in the core substrate 12 and only the upper surface of the electrode pad 11P may be exposed from the core substrate 12. In this case, the upper surface of each electrode pad 11P is substantially flush with the upper surface 12A of the core substrate 12. Here, the second insulating layer 22, which covers the upper surface 12A of the core substrate 12, and the insulating layer 23, which covers the lower surface 12B of the core substrate 12, may be omitted. In this case, the wiring pattern 32B is formed on the upper surface 12A of the core substrate 12, and the wiring pattern 32B is directly connected to the upper surface of the electrode pad 11P without the via wires 32A. The second wiring layer 33 is formed on the lower surface 12B of the core substrate 12.

In the embodiment described above, the present invention is embodied in a method for manufacturing a batch of units but may be embodied in a method for manufacturing a single unit.

For example, a ceramic material, such as aluminum nitride or alumina, silicon, glass, and the like may be used as the material of the core substrate 12 in the embodiment described above. In this case as well, the insulating layer 20 is an insulating layer having higher adhesiveness to the metal film (e.g., electroless plating film) than the core substrate 12 by using a material similar to the embodiment described above as the material of the insulating layer 20 (first insulating layer 21) that covers the hole wall surface of the through hole 12X of the core substrate 12.

In the embodiment described above, the semiconductor chip 3 mounted on the semiconductor package 1 serves as an electronic component. The electronic component is not limited to the semiconductor chip 3, and for example, may be a chip resistor, a chip capacitor, a crystal oscillator, and the like.

In another example, another semiconductor package is mounted on the semiconductor package 1 in place of the semiconductor chip 3. In this case, the semiconductor device is a package on package (POP) in which a plurality of semiconductor packages are stacked.

In the illustrated example, the semiconductor chip 3 is also referred to as a second semiconductor chip. The semiconductor chip 11 is also referred to as a first semiconductor chip. The through hole 12X serves as a first through hole. The through hole 20X serves as a second through hole. The insulating layers 23, 24, 25, 26, and 27 all serve as a third insulating layer. The solder resist layers 41 and 41A serve as a first solder resist layer. The solder resist layer 42 serves as a second solder resist layer. The insulating layer 71 serves as a first resin. The insulating layers 74, 78, 80, and 81 all serve as a second resin.

The disclosure further encompasses various examples described below.

1. A method for manufacturing a semiconductor package, the method comprising:

forming a first through hole in a core substrate, which embeds at least a portion of a semiconductor chip, wherein the first through hole extends through the core substrate in a thickness direction, and the core substrate includes a first surface and a second surface, which is opposite to the first surface;

forming a first insulating layer in the first through hole, wherein an adhesiveness of the first insulating layer to metal is higher than an adhesiveness of the core substrate to the metal;

forming a second through hole that extends through the first insulating layer in the thickness direction without exposing a hole wall surface of the first through hole; and forming a through via that covers a hole wall surface of the second through hole and that provides an electrical conduction path between the first surface and the second surface of the core substrate through an electroless plating process and an electrolytic plating process; wherein
the forming a first insulating layer includes
arranging a first resin in a semi-cured state on the first surface of the core substrate including the first through hole,
arranging a second resin in a semi-cured state on the second surface of the core substrate, and
while heating and pressurizing the first resin and the second resin to fill the first through hole with the first resin and the second resin, forming a second insulating layer that covers the first surface of the core substrate with the first resin remaining outside the first through hole and forming a third insulating layer that covers the second surface of the core substrate with the second resin remaining outside the first through hole.

2. The method according to clause 1, wherein
the forming a first through hole is performed by irradiating the first surface of the core substrate with a laser beam in a laser process, and
the forming a second through hole is performed by irradiating the second insulating layer with a laser beam in a laser process.

The present examples and embodiments are to be considered as illustrative and not restrictive, and the invention is not to be limited to the details given herein, but may be modified within the scope and equivalence of the appended claims.

The invention claimed is:

1. A semiconductor device comprising:
a semiconductor chip including a first main surface and a second main surface, which is opposite to the first main surface, wherein electrode pads are formed on the first main surface;
a core substrate embedding at least the second main surface of the semiconductor chip, wherein the core substrate includes a first surface and a second surface respectively corresponding to the first main surface and the second main surface of the semiconductor chip, and a hole wall surface that defines a first through hole extending through the core substrate in a thickness direction;
a first insulating layer that covers the hole wall surface of the first through hole, wherein the first insulating layer in the first through hole includes a hole wall surface that defines a second through hole extending through the core substrate in the thickness direction;
a second insulating layer that covers the first surface of the core substrate;
a third insulating layer that covers the second surface of the core substrate;
a first wiring layer stacked on the second insulating layer and electrically connected to the electrodes pads;
a second wiring layer stacked on the third insulating layer; and
a through via that covers the hole wall surface of the second through hole, extends in the thickness direction traversing the first insulating layer, the second insulating layer, and the third insulating layer, and electrically connects the first wiring layer and the second wiring layer,
wherein adhesiveness of the first to third insulating layers to a metal of the through via is higher than adhesiveness of the core substrate to the metal.

2. The semiconductor device according to claim 1, wherein
the first through hole includes a tapered portion that gradually narrows from the first surface of the core substrate toward an intermediate position of the core substrate in the thickness direction, and
the second through hole includes a tapered portion that gradually narrows from the second insulating layer toward an intermediate position of the first insulating layer in the thickness direction.

3. The semiconductor device according to claim 2, wherein
the first through hole is hourglass-shaped and includes a tapered portion, which gradually narrows from the second surface of the core substrate toward the intermediate position of the core substrate in the thickness direction, and a constricted portion, which is located at the intermediate position of the core substrate, and
the second through hole is hourglass-shaped and includes a tapered portion, which gradually narrows from the third insulating layer toward the intermediate position of the first insulating layer in the thickness direction, and a constricted portion, which is located at the intermediate position of the first insulating layer in the thickness direction.

4. The semiconductor device according to claim 1, wherein the third insulating layer is thicker than the second insulating layer.

5. The semiconductor device according to claim 1, wherein the third insulating layer is an insulative resin layer containing reinforcement material.

6. The semiconductor device according to claim 1, wherein the semiconductor chip is arranged toward the first surface of the core substrate in the thickness direction of the core substrate.

7. The semiconductor device according to claim 1, further comprising: an outermost wiring layer formed over the first surface or the second surface of the core substrate;
a connection pad electrically connected to the outermost wiring layer; and
an electronic component electrically connected to the connection pad and mounted on the connection pad.

8. The semiconductor device according to claim 7, wherein
the semiconductor chip is a first semiconductor chip, and
the electronic component is a second semiconductor chip mounted above the first surface of the core substrate through the connection pad formed above the first surface of the core substrate.

9. A semiconductor device comprising:
an insulative core substrate including a hole wall surface that defines a through hole;
a semiconductor chip that includes an electrode pad side surface exposed from the insulating core substrate at a portion excluding the through hole and a non-electrode pad side surface opposite to the electrode pad side surface and embedded in the insulative core substrate;
a first insulating layer that covers a surface of the insulative core substrate including the hole wall surface of the through hole; and
a patterned wiring layer covering the first insulating layer, wherein the patterned wiring layer includes a tubular via that covers the first insulating layer entirely in the through hole and extends through the core substrate in the thickness direction, and
wherein the tubular via has inner surface roughness smoother than hole wall surface roughness of the through hole.

10. The semiconductor device according to claim 9, wherein the tubular via has a tapered shape and includes a first opening and a second opening, the second opening having a diameter larger than that of the first opening.

* * * * *